United States Patent
Maranzana et al.

(10) Patent No.: US 9,946,732 B2
(45) Date of Patent: Apr. 17, 2018

(54) METHOD AND SYSTEM FOR COMPARING 3D MODELS

(71) Applicant: SOCOVAR, SOCIÉTÉ EN COMMANDITE, Montreal (CA)

(72) Inventors: Roland Maranzana, Montreal (CA); Omar Msaaf, Montreal (CA); Louis Rivest, Montreal (CA)

(73) Assignee: SOCOVAR, SOCIÉTÉ EN COMMANDITE, Montreal, QC (CA)

( * ) Notice: Subject to any disclaimer, the term of this patent is extended or adjusted under 35 U.S.C. 154(b) by 0 days.

(21) Appl. No.: 15/104,422

(22) PCT Filed: Dec. 12, 2014

(86) PCT No.: PCT/CA2014/051210
§ 371 (c)(1),
(2) Date: Jun. 14, 2016

(87) PCT Pub. No.: WO2015/085435
PCT Pub. Date: Jun. 18, 2015

(65) Prior Publication Data
US 2016/0314341 A1 Oct. 27, 2016

Related U.S. Application Data

(60) Provisional application No. 61/916,279, filed on Dec. 15, 2013.

(51) Int. Cl.
*G06K 9/00* (2006.01)
*G06F 17/30* (2006.01)
(Continued)

(52) U.S. Cl.
CPC .. *G06F 17/30259* (2013.01); *G06F 17/30256* (2013.01); *G06F 17/30277* (2013.01);
(Continued)

(58) Field of Classification Search
CPC ............... G06F 17/30; G06F 17/30259; G06F 2217/04; G06F 2217/08; G06F 2217/10;
(Continued)

(56) References Cited

U.S. PATENT DOCUMENTS 6,072,496 A * 6/2000 Guenter ............. G06K 9/00201
345/419
6,160,907 A * 12/2000 Robotham .............. G06T 13/00
345/419
(Continued)

FOREIGN PATENT DOCUMENTS

EP 2284770 A1 2/2011
JP 2012-43419 A 3/2012
(Continued)

OTHER PUBLICATIONS

EP14869145 Search report and opinion dated Aug. 24, 2017.
(Continued)

*Primary Examiner* — Aklilu Woldemariam
(74) *Attorney, Agent, or Firm* — Anglehart et al.

(57) ABSTRACT

A method is disclosed allowing digital 3D models to be indexed, searched, and compared, and to display the results in a 3D space. The method comprises four complementary parts: displaying, comparing/searching, face reconciliation, and ranking results. Each of these parts can fit in one another or be used independently. The implementation of a process for searching/comparing 3D models based on descriptors at least partly related to faces requires a face reconciliation process (pairing of faces between 3D models).

11 Claims, 10 Drawing Sheets

(51) Int. Cl.
    *G06F 17/50* (2006.01)
    *G06T 19/20* (2011.01)
    *G06K 9/62* (2006.01)
    *G06T 7/66* (2017.01)
    *G06T 7/30* (2017.01)

(52) U.S. Cl.
    CPC ......... *G06F 17/50* (2013.01); *G06K 9/00214* (2013.01); *G06K 9/6203* (2013.01); *G06K 9/6215* (2013.01); *G06T 7/30* (2017.01); *G06T 7/66* (2017.01); *G06T 19/20* (2013.01); *G06K 9/00* (2013.01); *G06T 2219/2016* (2013.01)

(58) Field of Classification Search
    CPC ............... G06F 17/30268; G06F 17/50; G06F 17/30271; G06F 17/30554; G06K 9/00201; G06K 9/44; G06K 9/6892; G06K 9/00228; G06K 9/00288; G06T 17/00; G06T 19/00; G06T 2200/16; G06T 2210/32; G06T 2210/56; G06T 7/97; G06T 15/00; G06T 2207/10024; G06T 2207/30241; G06T 2207/30244; G06T 7/248; G06T 7/251; G06T 7/593; G06T 7/73; G06T 7/75; G06T 19/20; G06T 2215/16; G06T 7/60; G06T 15/205; G06T 2207/10068; A61B 8/08; A61B 8/4245; A61B 8/483; A61B 1/005; A61B 1/04; A61B 34/20; A61B 5/061; A61B 6/032; H04N 13/0207; H04N 13/0275; A63F 2300/5553; B29C 67/0088; F41C 23/04; F41C 23/12; G01M 17/02; G01N 21/8851; G01N 21/9515
    USPC ........ 382/154, 275, 376; 345/427, 419, 420, 345/622, 627
    See application file for complete search history.

(56) References Cited

U.S. PATENT DOCUMENTS

| | | | | |
|---|---|---|---|---|
| 6,434,278 B1 * | 8/2002 | Hashimoto | | G06T 17/00 345/583 |
| 6,556,196 B1 * | 4/2003 | Blanz | | G06K 9/00275 345/419 |
| 6,625,607 B1 * | 9/2003 | Gear | | G06F 17/50 |
| 6,879,323 B1 * | 4/2005 | Takezawa | | G06T 17/00 340/5.83 |
| 6,999,073 B1 * | 2/2006 | Zwern | | G06T 17/005 345/420 |
| 7,149,677 B2 | 12/2006 | Jayaram et al. | | |
| 7,212,664 B2 * | 5/2007 | Lee | | G06K 9/00288 345/420 |
| 8,072,450 B2 | 12/2011 | Chang et al. | | |
| 2002/0120920 A1 * | 8/2002 | Jayaram | | G06F 17/50 717/137 |
| 2004/0249809 A1 * | 12/2004 | Ramani | | G06F 17/30259 |
| 2005/0031194 A1 * | 2/2005 | Lee | | G06K 9/00288 382/154 |
| 2006/0285770 A1 * | 12/2006 | Lim | | G06K 9/6206 382/276 |
| 2009/0096790 A1 * | 4/2009 | Wiedemann | | G06K 9/00201 345/427 |
| 2009/0135177 A1 * | 5/2009 | Strietzel | | G06Q 30/02 345/419 |
| 2009/0040225 A1 | 12/2009 | Wang et al. | | |
| 2010/0201682 A1 * | 8/2010 | Quan | | G06K 9/00704 345/419 |
| 2013/0336583 A1 * | 12/2013 | Ernst | | G06K 9/6202 382/165 |
| 2014/0028799 A1 * | 1/2014 | Kuffner | | G01B 11/24 348/46 |
| 2014/0293016 A1 * | 10/2014 | Benhimane | | G06T 17/00 348/50 |

FOREIGN PATENT DOCUMENTS

WO    WO 2007/098929 A1    9/2007
WO    WO 2013/044484 A1    4/2013

OTHER PUBLICATIONS

Kolonias I et al, "Fast Content-Based Search of VRML Models Based on Shape Descriptors", IEEE Transactions on Multimedia, IEEE Service Center, Piscataway, NJ, US, (Feb. 1, 2005), vol. 7, No. 1, pp. 114-126.
PCT/CA2014/051210 IPRP English version.
PCT/CA2014/051210 IPRP with related claims in French.
PCT/CA2014/051210 ISR.
PCT/CA2014/051210 search strategy.
PCT/CA2014/051210 Written Opinion.

* cited by examiner

METHOD AND SYSTEM FOR COMPARING 3D MODELS

The present application claims priority from U.S. provisional patent application No. 61/916,279, filed Dec. 15, 2013.

TECHNICAL FIELD

The present application generally relates to the field of three-dimensional (3D) models, for example digital representation of a 3D environment. More particularly, it relates to comparing 3D models, notably through the use of descriptors, for the purposes of a comparative search, classification and/or analysis of the parts.

BACKGROUND

Three-dimensional digital representations of objects are commonly used in the fields of engineering, medical science, video games, cinema, and even in mass market applications (for example Sketch Up by Google, now Trimble). This practice is made possible by 3D creation and editing software, including CAD (Computer-aided design) systems, reverse engineering and other 3D reconstruction techniques, but also thanks to 3D scanners. All these methods generate digital models in 3 dimensions. Some create 3D models describing limits between objects and their environment, and are known as boundary representation or B-rep, seen for example in the STEP standard or in geometric modelling kernels like Parasolid or Acis. Others go with a tessellation (STL or VRML formats, for example). Those models can include more information, which is not strictly geometric.

The aforementioned 3D model types are commonly used in businesses and in multiple aspects of day to day life, and their popularity are rapidly increasing. As a result, several problems exist relating to: (i) indexing 3D models; (ii) retrieving similar digital objects; (iii) comparing them in order to identify their differences or identical parts; and (iv) displaying relevant results to insure an exploitation which is simple and efficient according to the defined criteria.

There are currently two distinct categories of systems: the first category relates to comparing a reference 3D model with a second 3D model and determine the differences between them, whereas the second category relates to searching for 3D models which resemble a reference 3D model.

Systems/Tools for Comparing 3D Models

Several computer applications, such asked systems, offer methods to precisely compare two 3D models with one another, or to compare a 3D model with a scatter plot or a 3D model created from a real object. In such methods, two 3D models are first selected. Multiple methods can then be used to compare these two models. It is possible to compare topological and geometrical structures using a graphing approach (Graph mapping, for example as described in WO 2007/098929 A1), or using a point-based method (for example, as described in U.S. Pat. No. 7,149,677 B2, or by using the method of least squares as used in Innovmetric's product or U.S. Pat. No. 8,072,450 B2). Some methods require that both models use the same frame of reference, be on the same computer application (same CAD system, for example), and use the same geometric representation. Geometric and topological-based methods imperatively require that both the 3D models being compared respect these conditions. Depending on the comparison method used, the 3D models can be marked to distinguish identical parts and different parts of the two 3D models by associating for example a state (identical, modified, unique) or quantifying the differences between them (a distance between points in models A and B respectively, for example). The results of the comparison are then displayed, either by (i) superimposing the two 3D models; (ii) applying a color gradient to highlight the differences between models A and B or vector fields; or (iii) by applying a colour code in accordance with the state defined in the previous module. This comparison indicates the parts of the 3D model (or the faces) that are identical, the unique parts (non-matched faces) or modified (matched faces with a difference), and possibly parts added on one model but not the other (through asymmetric display which shows what exists on A with respect to B, and what exists on B with respect to A). Even though all these systems are different, they have one common point: when comparing the reference 3D model with the target 3D model, they pick a single frame of reference or a unique "best fit" from which they will compare the complete 3D models to show the differences.

The Geometric Ltd application included in SolidWorks is a typical example of this category.

Systems/Tools for Searching 3D Models

A second category of computer applications offers the ability to search for 3D models by comparing a reference 3D model with a set of 3D models, with the goal of selecting 3D models based on their resemblance with the reference 3D model. This resemblance is usually expressed by a quantitative value used to rank the 3D models. Multiple methods are available to determine this resemblance. First, each 3D model is analysed in view of producing a more efficient representation to later perform the comparisons. This representation is often labelled under multiple terms, such as a descriptor, a representation, and an index. Notwithstanding its appellation, this representation can have multiple forms, for example a graph (US 2004/0249809 A1), a fixed vector of N dimensions (U.S. Pat. No. 6,625,607 B1) or a vector varying according to the 3D model, etc. These descriptors are usually saved for use when the comparisons are performed. A 3D model is picked to be used as a reference. In some cases, the reference 3D model is replaced by images, photos or drawings in 2 dimensions [A 3D Model Search Engine, Patrick Min, Ph.D. Dissertation, Princeton University, 2004]. If necessary, its descriptor is calculated. The descriptors are compared. Here too, multiple methods are described in [Content-based Three-dimensional Engineering Shape Search, K. Lou, S. Prabhakar, K. Ramani, Proceedings of the 20th International Conference on Data Engineering 2004]. According to the results of the comparison, the similar 3D models are generally ranked by a quantity, which is called a similarity or resemblance index. These results are then displayed in different forms, usually using small-sized images (icons, thumbnails).

As mentioned previously, numerous approaches have been proposed to search 3D models using a reference 3D model. Some approaches look for organic shapes, while others look for permissive similarities (e.g. locating cars, chairs, glasses). These methods were not conceived to determine whether two 3D models are exactly the same, with a precision of the same order of magnitude as their manufacturing tolerance. Systems like Geolus by Siemens or GeoSearch by Cadenas are representative of this category. They analyze 3D models approximated by flat-representations to generate their descriptors, which inevitably deteriorates their precision. Known methods which extract descriptors from 3D models and compare them with each other typically demand a lengthy computation time and are thus difficult to apply when there is an significant number of 3D models to process (more than a million, for example), or for an interactive search.

However, known search systems or tools for 3D models do not have the information nor the technology to offer the possibility to launch a search based on complete 3D models that favour certain parts of those models.

SUMMARY

There is a need for systems that retrieve digital 3D models from heterogeneous sources which are similar in whole or in part, that determine and qualify differences by considering a reference 3D model in whole or in part, that display the results with all relevant information relating tithe differences and similarities, and does so in an extremely precise manner while following numerous criteria, while being adapted to handle a large number of 3D models.

To address this need, a process is provided which first constructs descriptors to find (or index) 3D models. This descriptor is characterized by its capacity to capture properties of an entire 3D model, of each solid object (in the ordinary sense of a geometric representation and tridimensional topology) creating a 3D model and proprieties for each face (also in the ordinary sense of a geometric representation and tridimensional topology) creating the 3D model. The boundary representations do not guarantee the unique representation of a 3D model, i.e. multiple boundary representations could correspond to the same object. To obtain this property which is essential to 3D model comparison, faces that are G2 continuous (second geographic derivative) are grouped along one of their common edges, and the faces constructed on a non-continuous G2 surface are split along the discontinuity. All subsequent steps in the process, except the 3D display, can be carried out on the descriptors without necessarily having to use the 3D models themselves.

Next, the characteristics of the descriptors are compared according to criteria selected by an operator. This phase is based on two important elements of the invention. One element comprises the reconciliation of the terms or characteristics of the descriptors, which corresponds to a pairing of the solid body and faces of the 3D models that can then be expressed in different frames of reference, different CAD systems, and different geometric and topological representations, allowing the consideration of only a part of the model during processing. The other element comprises a more rigorous qualification of the differences with respect to the faces, in contrast to existing methods which are limited to identical, modified or new. The process allows identifying up to nine characteristics (identical, intrinsically identical, geometrical type identical, different topology, etc.), and a face can have multiple qualities simultaneously. The marking for the displaying is based on these properties (for example, a particular colour can be linked to a combination of qualities) and the criteria of the query made by the operator. The aggregation of all the differences can be used to determine the resemblance index (or similarity index) for ranking the 3D models.

Since all the digital objects are 3D models, a new way of communicating the results as a 3D structure in a unique 3D environment is provided. One of the axes represents the resemblance index, the colours of the faces are used to mark the types of differences, and the two remaining axes are, for example, used to represent other sizes or properties, like costs, dates, suppliers, configurations, versions, etc.

This process can be used, for example, (i) to retrieve 3D models identical to a reference 3D model with a precision akin to fabrication precision (tracking duplicates and geometric clones); (ii) to find a part (solid object) identical or similar in one or many mechanical systems (a 3D model); (iii) to find a component (set of solid objects) identical or similar in a system or multiple systems (3D models); (iv) to locate similar 3D models in large banks of models which may be distributed; etc.

Due to the descriptors capturing proprieties with a very fine granularity (a set of parameters or characteristics for each face) and to the capacities of the comparator, especially the notion of reconciliation and the qualification of faces, the system also enables the tracking of form features, meaning parts of 3D models, for example to locate: (i) a set of through holes of a given diameter and axial spacing (a set of disjoint faces and their parameters) in various 3D models; (ii) a key slot (a set of adjacent faces and their intrinsic parameters); (iii) to retrieve a face or a set of identical or similar faces in one or many 3D models; etc.

Accordingly, different aspect of the invention include: (i) the method of searching similar 3D models based on volumetric and boundary descriptors; (ii) the reconciliation of terms or characteristics of the descriptor, allowing for the multi repositioning and retrieving of sub-parts of the 3D model (form features); (iii) the notion of qualifying the differences; and (iv) the displaying of results combining the similarities and differences between multiple 3D models in a unique environment of 3 dimensions.

According to a first aspect of the invention, a process is provided for comparing 3D models for searching, ranking and/or comparatively analysing boundary representations of the 3D models. According to this process, a descriptor is provided to each of the plurality of 3D models, the descriptor comprising geometric characteristics of the 3D models which do not vary according to the frame of reference of the model, and geometric characteristics of the 3D models that depend on the frame of reference. Characteristics which do not vary according to the frame of reference are used to pair the parts of a first 3D model and the parts of at least one other model. Characteristics that depend on the frame of reference are used at least for the parts where the pairing is successful, where a group of transformations is determined for associating the parts of the first 3D model with the parts of at least one other model. At least one group of identical transformations is determined, where the resemblances and differences between 3D models are identified, at least in part, by said group of similar transformations.

The geometric characteristics of the parts of the 3D model which do not vary according to the frame of reference of the 3D model can include the area, the eigenvalues of the moments of inertia and/or the perimeter of the flat faces of the 3D model. The geometric characteristics of the components of the 3D model which depend on the 3D model's frame of reference can include the center of gravity and/or the axes of the moments of inertia of the flat faces.

The step of determining at least one group of identical transformations can include determining at least two groups of identical transformations to allow the comparison of similar 3D models, where at least one part of the 3D models is in a different position or orientation.

According to a second aspect of the invention, a process is provided for comparing a 3D models for searching, ranking and/or comparatively analysing boundary representations of the 3D models. According to this process, a descriptor is provided to each one of a plurality of 3D models, the descriptor comprising geometric characteristics of the 3D models that do not vary according to the frame of reference of the 3D model and geometric characteristics of the models that are dependent on the frame of reference. Characteristics which do not vary according to the frame of reference are used to pair the faces of a first 3D model with those of at least one other model. Data is stored which is classified according to the determined similarities and differences between the characteristics associated with the descriptors and at least one 3D model. For at least the faces with a successful pairing, a transformation is determined which associates faces between the frames of reference of the first 3D model. One or more other 3D models is produced in which the characteristics are at least coded by colour or texture according to the data representing the similarities and the properties of the differences.

The geometric characteristics of the components of the 3D model which do not vary according to the modelling frame of reference can include the area, the eigenvalues of the moments of inertia and/or the perimeter of the flat faces of the 3D model. The geometric characteristics of the parts of the model that depend on the frame of reference can include the center of gravity and/or the axes of the moments of inertia of the flat faces.

According to a third aspect of the invention, a process is provided for comparing 3D model for searching, ranking and/or comparatively analysing boundary representations of the 3D models. According to this process, a descriptor is provided to each one of a plurality of 3D models, the descriptor comprising geometric characteristics of the models that do not vary according to the modelling frame of reference and geographic characteristics of the models that are dependent on the frame of reference. Characteristics which do not vary according to the frame of reference are used to pair the faces of a first 3D model with those of at least one other model. Pairing-related data collected for at least some other 3D models is stored. A first search result, ranking result, and/or result of detailed comparison of boundary representations of the 3D models are provided using at least a part of the initial pairing-related data. Characteristics that do not vary according to the frame of reference are again used to pair faces of the first 3D model with at least one other 3D model to build on the initial pairing-related data. A second search result, ranking result, and/or result of detailed comparison of boundary representations are provided using at least part of the refined pairing-related data.

According to a fourth aspect of the invention, a process is provided for comparing 3D models for searching, ranking and/or comparatively analysing boundary representations of the 3D models. According to this process, each of a plurality of 3D models is provided with a descriptor comprising characteristics of the 3D models. An increased or reduced importance is attributed to one or more characteristics in a first 3D model. A pairing value between a first 3D model and at least one other 3D model is generated using the characteristics and, when appropriate, the importance attributed to the one or more of the characteristics of the first model.

According to a fifth aspect of the invention, a process is provided for comparing 3D models for searching, ranking and/or comparative analysing boundary representations of the 3D models. According to this process, each of a plurality of 3D models is provided with a descriptor. A pairing value between a first model and numerous other 3D models is generated using their respective descriptors. A display is generated of numerous 3D models arranged spatially in groups, where the groups are defined by a shared descriptor characteristic. The groups can be arranged according to a search criterion or an importance given to one or more characteristics of the descriptors, or search weight.

According to a sixth aspect of the invention, a process is provided for comparing 3D models for searching, ranking and/or comparatively analysing boundary representations of the 3D models. According to this process, each of a plurality of 3D models is provided with a descriptor, uniformly taking into account continuous geometric faces of second order, known as "G2", preferably by merging them and cutting the faces whose surfaces would not be geometrically continuous of second order (surface G2).

According to a seventh aspect of the invention, a process is provided for comparing 3D models for searching, ranking and/or comparatively analysing boundary representations of the 3D models. According to this process at least two corresponding parts on two 3D models are selected. Respective similar parts are identified and different parts are qualified according to one or several types of differences. At least one of the 3D models is displayed by marking the identical and different parts according to their qualification.

In some embodiments, a 3D model search system used to locate 3D models within a collection of 3D models which correspond to a 3D model search query using 3D model descriptors comprises a characteristics selector used to select at least one characteristic or apart of the search query 3D model to which a different weight is attributed for searching purposes, and a 3D model comparator, the 3D model comparator being configured to compare a descriptor of the search query 3D model with the descriptors of the collection of 3D models, while taking into account the weight given to the characteristic or the part of the search query 3D model, and produce a list of models which corresponding according to the comparison.

The characteristics selector can attribute weighting values to the parameters of a descriptor of the search query 3D model. The system can also include a file of the search results and an image generator configured to generate a displayable image of at least part of the list of corresponding 3D models, arranged and organized according to predetermined criteria. The corresponding 3D models can be arranged according to a similarity index calculated from the descriptors. The predetermined descriptor criteria can include a criterion depending on the descriptor, characterized by the fact that the corresponding 3D models are classified according to characteristics which depend on the descriptor. The characteristics selector can be configured to recognize aspects which characterize the descriptors of the results file and to select one of the aspects characterizing the descriptors. The descriptors can include a volumetric component and a face and/or an edge component.

In some embodiments, a 3D model search system used to locate 3D models within a collection of 3D models which correspond to a 3D model search query using 3D model descriptors includes a selector to select a search query 3D model, a 3D model comparator configured to compare the descriptor of the search query 3D model with descriptors in the collection of 3D models and provide a list of corresponding 3D models, and a results file and an image generator to generate a displayable image of at least part of the list of corresponding 3D models, arranged and organized according to predetermined criteria.

The corresponding 3D models can be arranged according to a similarity index calculated from the descriptors. The predetermined criteria can include a criterion which depends on the descriptor, characterized by the fact that said corresponding 3D models are classified according to characteristics that depend on the descriptor. The image generated can present the models organized in multiple columns or rows according to their similar characteristics.

In some embodiments, the manufacturing process of a product is characterized by the use of a 3D model for manufacturing at least one part of the product, said 3D model being directly selected and possibly modified using a 3D model search/comparison system or using a process according to any of the embodiments of the present invention.

It should be understood that the present description potentially discusses multiple inventions, and the reference to the invention in this application can refer to any of those inventions.

Definitions

In this patent application, the following terms have the following meanings:

3D Model

In this text, the expression 3D model refers to a digital representation of an object in a 3 dimension environment. A 3D model describes the boundaries between one or a plurality of objects and their environment. The 3D models are commonly based on boundary representations (or B-rep) as in the STEP standard, or the geometric modellers of CAD or CAM systems, or tessellation, like in STL or VRML formats, for example. The boundary is composed of one or more faces, which is a surface limited by one or more outlines. A face, a plurality of faces (contiguous or not), and even a collection of faces representing a closed Euclidian subspace having 3 dimensions (generally called a solid object) are all 3D models. A collection of faces representing a plurality of solid objects is also 3D model. In this definition, every part of a 3D model is a 3D model, and any composition of 3D models is also a 3D model. 3D models can include information which is not purely geometrical, such as material properties or recommended manufacturing techniques.

Descriptor

A descriptor refers to a representation of a 3D model for a specific use, normally expressed in a more efficient and concise manner than the 3D model itself. It is a set of information which characterizes a 3D model or part of it. In some cases, the descriptor can include list of volumetric geometrical characteristics of a 3D model, notably the dimensions of the box bounding the 3D model, its volume, its area, the main moments of inertia, its barycentre, its main axes of inertial, a list of solid objects forming that 3D model, and for each of the solid objects, each also being 3D models themselves, their volume, total area, main moments of inertia, barycentre and main axes of inertia.

In some cases, a descriptor can include notably a list of the faces of the 3D model and, for each of them, a list of characteristics, such as the type of the underlying surface and its parameters, the dimensions of the bounding box, the area, the perimeter, the main moments of inertia, the barycentre, and the main axes of inertia, for example. The differences and similarities between 3D models are obtained from a process which will be called descriptor comparison. In its most simplified and minimal form, a 3D model can be a full-fledged descriptor. Likewise, a 3D model of a more complex object can itself have many descriptors, whether by being composed of many descriptors (each being able to constitute a 3D model), or by considering only certain information and not other information which could characterize the object itself.

Form Features

A form feature refers to apart or a property (or an attribute) of a descriptor (and thus of a 3D model) presenting a special interest for a given treatment. An element of the descriptor, or any combination of a plurality of elements of the descriptor, defines a form feature. For example, the diameter of a cylindrical face is an elementary form feature; the value of an axial spacing of two holes is a form feature, and a round-ended keyway is a form feature. Part of a descriptor corresponds to each of the examples, or the form feature can be determined from the descriptors. In its most elementary form, the form feature is simply called a characteristic. A characteristic is said to be intrinsic to a 3D model or its descriptor if the form feature depends only on said 3D model or its descriptor, and can be determined from it and not from its context, i.e. a 3D model which encompasses the characteristic. Otherwise, the characteristic is deemed to be extrinsic.

Pairing

Pairing refers to a process of evaluating a match between characteristics of two descriptors. For example, one part of a descriptor could characterize a solid object or a face. The pairing consists in matching this part of the descriptor with another part of a descriptor (either the same descriptor or a different one) when both parts share common characteristics (e.g. identical or are within an acceptable range of values). This process allows to pair solid objects or faces of 3D models using their respective descriptors, without having to take their spatial positioning into account. This pairing method does not require that the 3D models be described using the same geometric representation (STEP and Parasolid, for example), nor that they be expressed in a common frame of reference.

Reconciliation

Reconciliation refers to the process of grouping parts of descriptors while taking into account the relative spatial position of form features related to the parts of the paired descriptor. This process consists in determining transformation matrix groups which allow putting form features in a common frame of reference. This process allows, among others, recognizing identical or similar form features between 3D models. With respect to faces for example, the pairing identifies faces which share intrinsic characteristics, such faces which have a cylindrical type, with a diameter ranging between 5 and 6 mm, and a length of 20 mm. During reconciliation, extrinsic parameters are taken into account, for example, the direction of the axis of the cylindrical faces is equal to the Z axis and the axial spacing is of 20 mm. This pairing—reconciliation process can be applied iteratively.

Comparative Analysis of Descriptors

Comparative analysis of descriptors refers to a process which allows searching, determining and qualifying identical and different characteristics between descriptors according to the query specified by the operator. The comparison is made on a whole of the descriptor, or on parts of it and a weighting of each of the parts can be specified by the operator to emphasise certain form features, or even to consider only part of the 3D model. The resemblance index (or similarity index) is determined from the comparative analysis of the descriptors.

Operator

An operator refers equally to a human operator or another computer system, interacting with the system, in interactive mode or off line (batch mode).

BRIEF DESCRIPTION OF THE DRAWINGS

Embodiments of the invention will be more easily understood through the figures, which are illustrated further below and accompany numerous examples appearing in the detailed description of embodiments of the invention, wherein.

DETAILED DESCRIPTION

Figure 1:
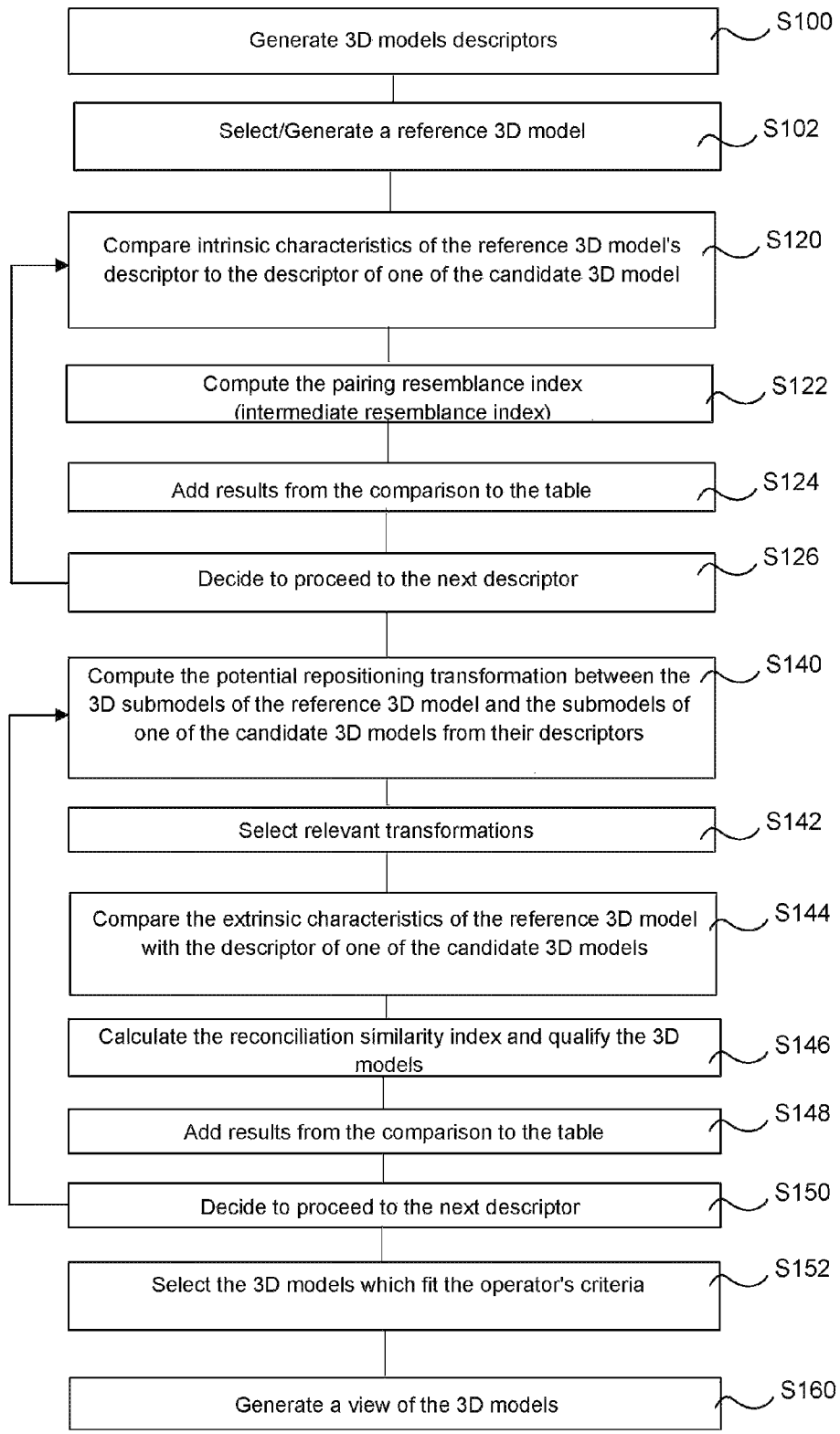
FIG. 1 is a flow chart of the steps in a process according to an embodiment of the invention.
Figure 2:
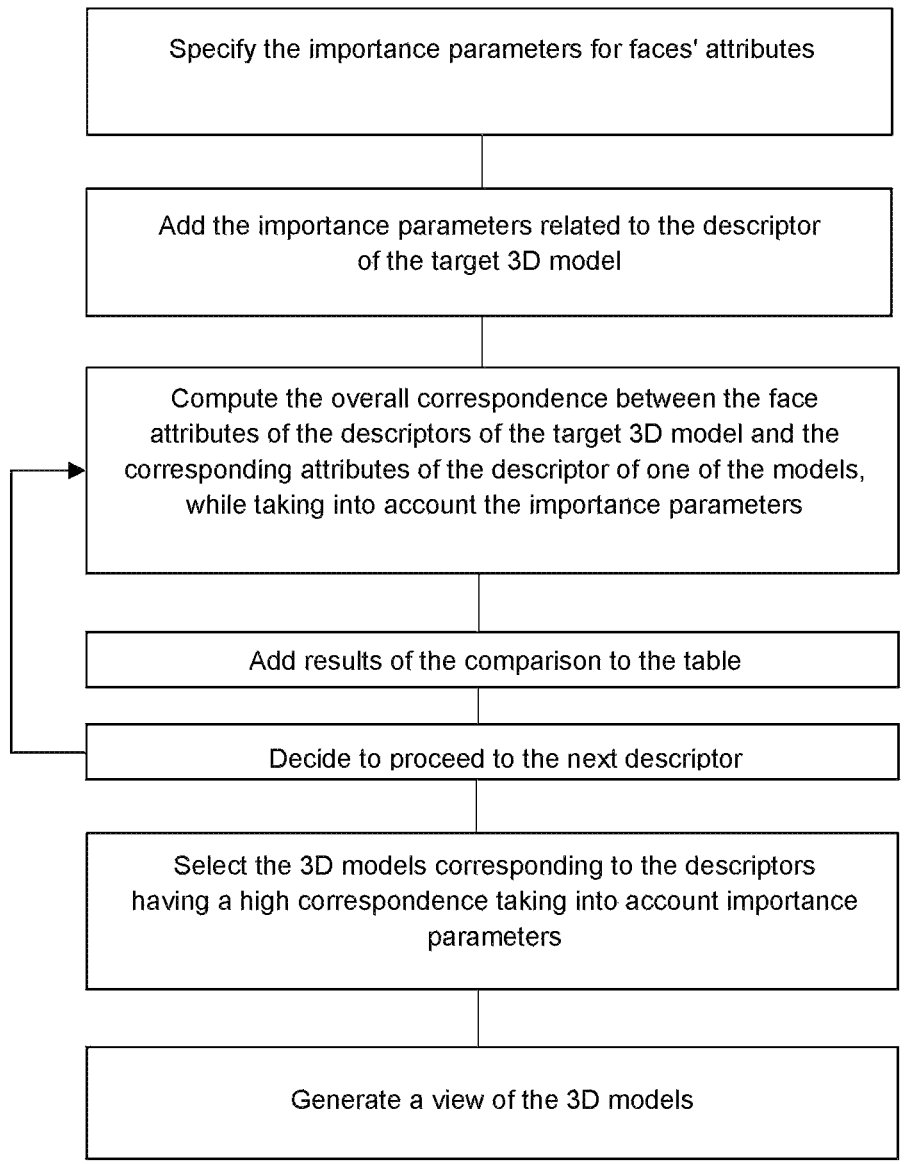
FIG. 2 is a flow chart of the steps in a process according to another embodiment of the invention.
Figure 3:
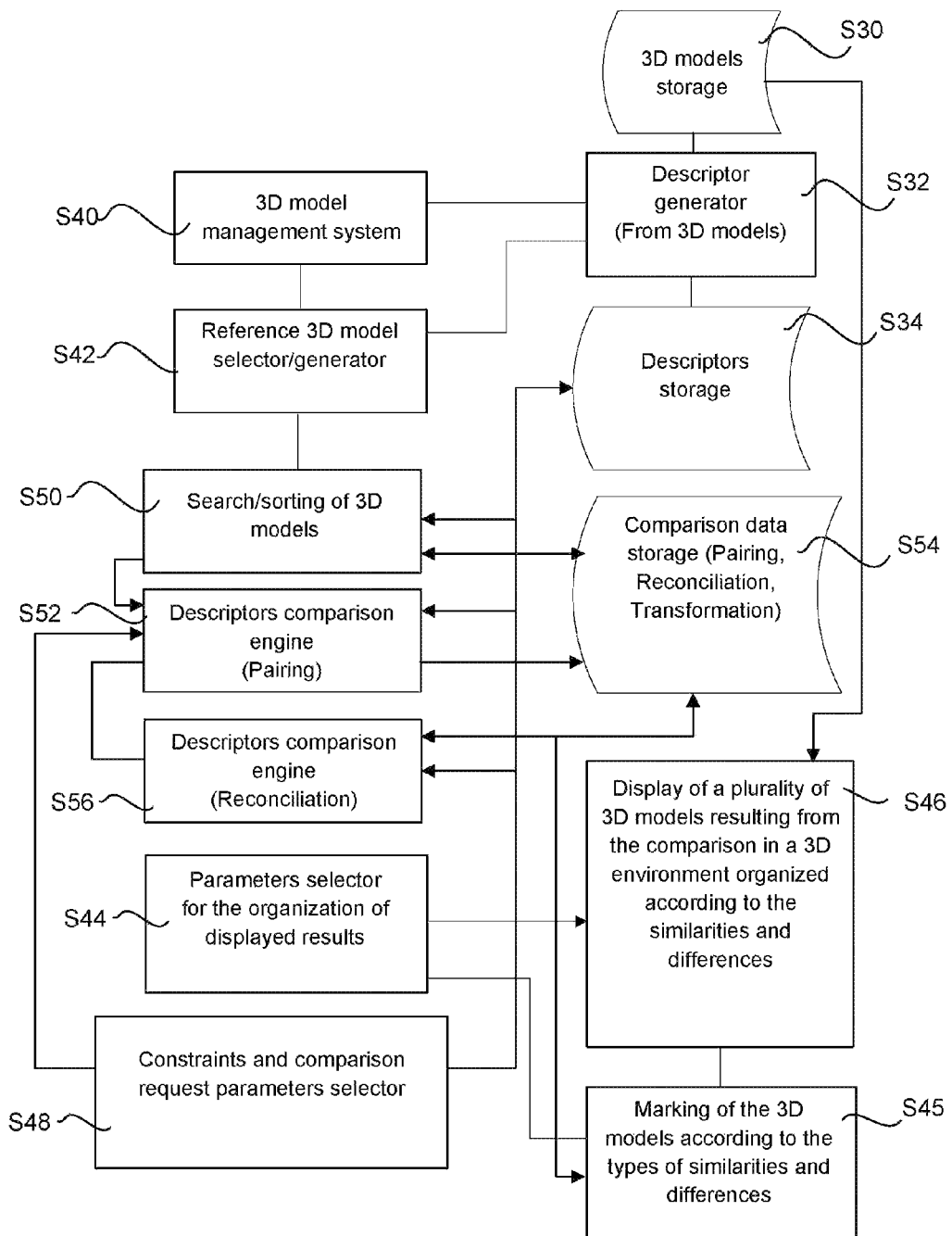
FIG. 3 is a block diagram of a computer system according to an embodiment, configured to execute at least the process of FIG. 1.

Embodiments of the invention are described according to FIGS. 1 and 2, which show the sequence of steps to be completed to determine in a concurrent manner the likenesses (or similarities) and differences between a reference 3D model and a number of other 3D models using their descriptors. The number of 3D models considered can vary greatly. Insofar as the objective is to compare a reference 3D model with a few other known models, this number can be small. However, if the objective is to find an appropriate or similar model, it is possible to search amongst thousands or even millions of existing 3D model descriptors. FIG. 3 illustrates a block diagram for a software system which can carry out the steps shown in FIGS. 1 and 2.

Figure 4:
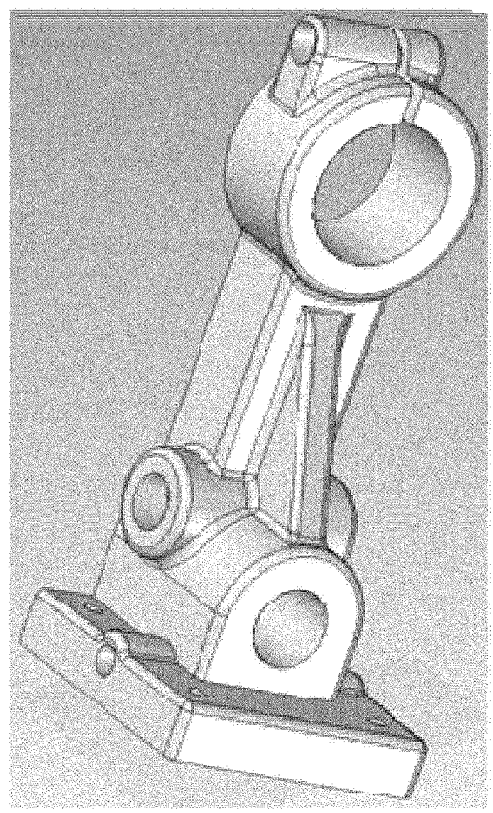
FIG. 4 is an orthogonal projection of a 3D model.
Figure 5:
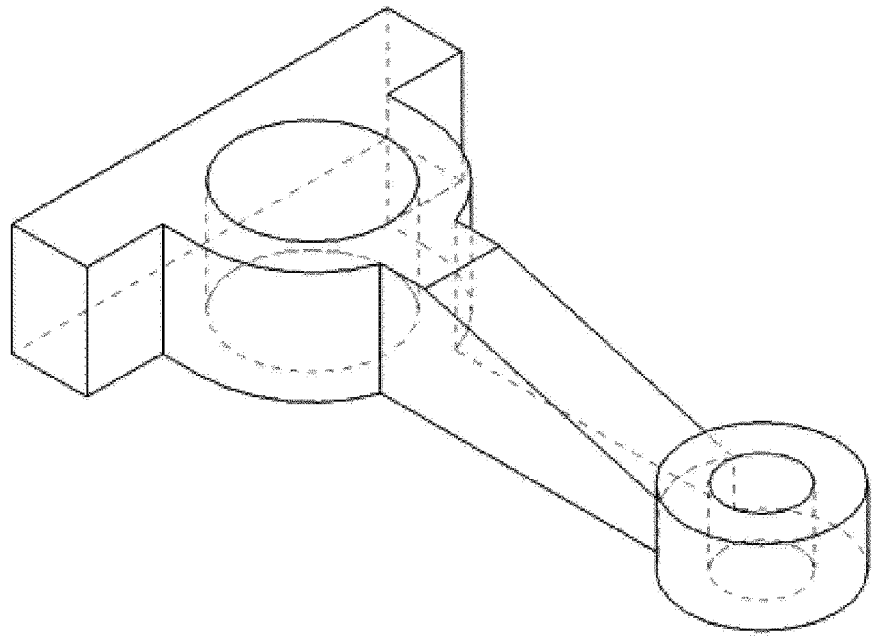
FIG. 5 is an orthogonal projection of a simplified version of the 3D model of FIG. 4.

FIG. 4 illustrates an example of a 3D model for a part. To simplify the description of the following embodiments, FIG. 5 shows a simplified version of the 3D model in FIG. 4, and this simplified version will be used in the following description. The part shown has two circular openings of different dimension in its upper and lower portions, and a middle part which links its upper and lower portions, said lower portion being shaped as a flat base.

Figure 6:
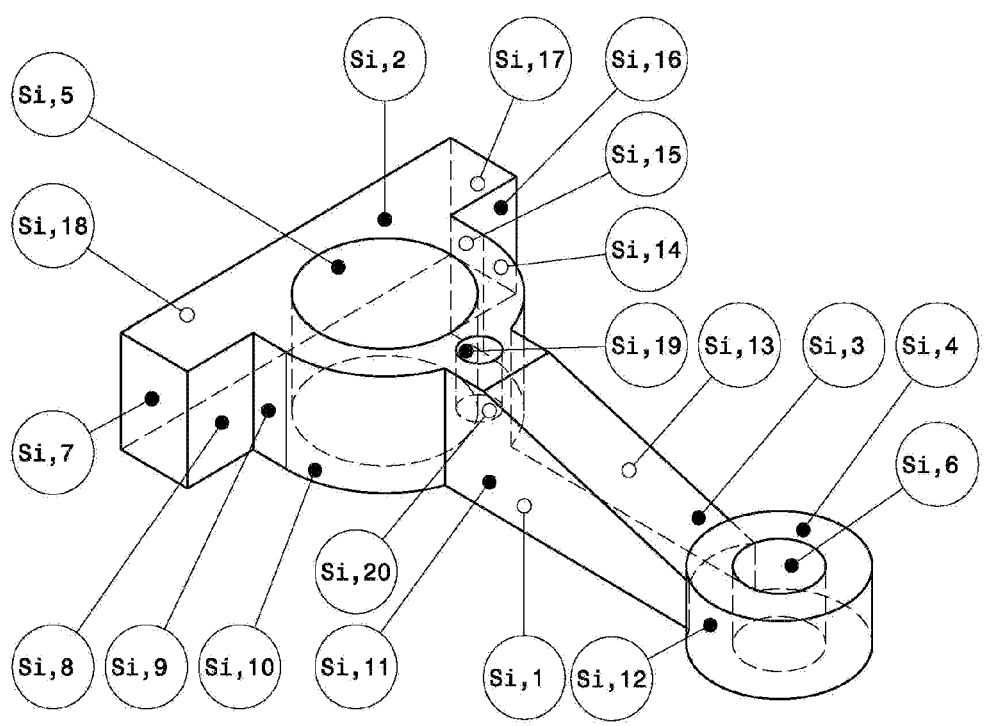
FIG. 6 is an orthogonal projection of the 3D model of FIG. 5, which identifies the faces of the 3D models in a generic fashion.

In FIG. 6, the various faces are labelled as Si, 1 to Si, 20. This labelling is arbitrary and can vary from one 3D model to another. Thus, the marking Sm,f of a face identifies the face f of the 3D model m. The descriptor in this embodiment could consist in a list of characteristics, for example the type of the model (Type), the parameters which depend on the type (Type Par), the volume (in the case of a solid object) or the area (in the case of a face) (Int(N)), the area for a solid object or the perimeter of a face (Int(N−1)), the centre of gravity (Gx,y,z), the moments of inertia (M1,2,3), the inertial axes (Ai x,y,z with i=1,2,3) and the dimensions of the bounding box (Bx,y,z) for each solid object constituting the 3D model and for the complete 3D model and each of its faces.

The boundary representation does not respect the uniqueness property. That is, more than one boundary representation can exist for a 3D model. However, this uniqueness property is essential to the comparison of 3D models. For example, when using different modelling systems (e.g. two CAD systems) it is possible to cut up the boundary of a 3D model into faces not to be unique. To remedy this situation we used faces "strictly continuous G2". Thus, faces can be grouped into one single face if the second geometric derivative, usually noted as G2, is continuous along an edge common to two faces. Likewise, a face with a non-continuous G2 underlying surface would be split in halves so that the respective underlying surface of each half is continuous G2. By proceeding as such, the unicity property is restored for the faces of the boundary representation.

Figure 7A:
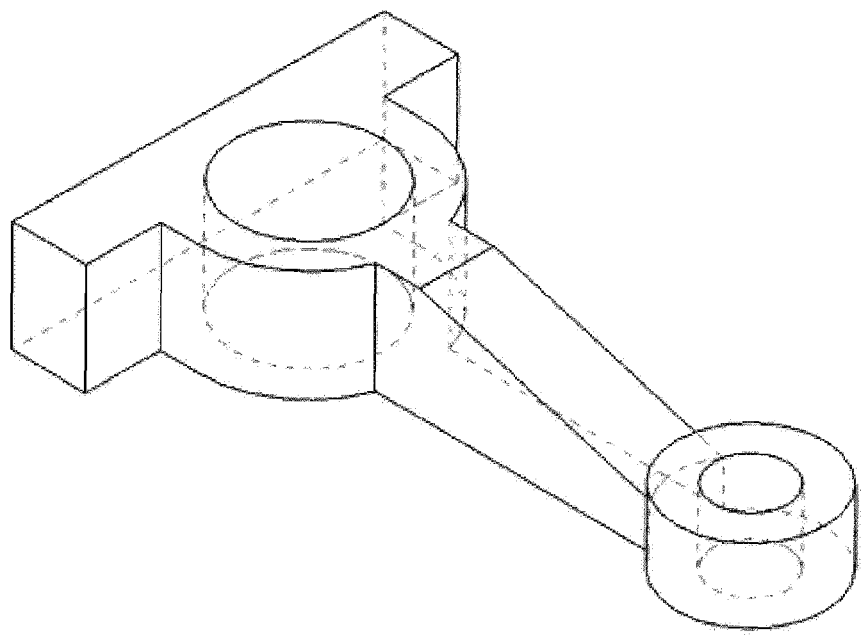
FIG. 7A is an orthogonal projection of a 3D model used as a reference in the description of this embodiment.

Table 1 provides the values of the characteristics for the 3D model of FIG. 7A. The association between the identifier of a 3D model in the descriptor (Mod 3D column) and the 3D model itself can be made through a correspondence table, for example.

Figure 7B:
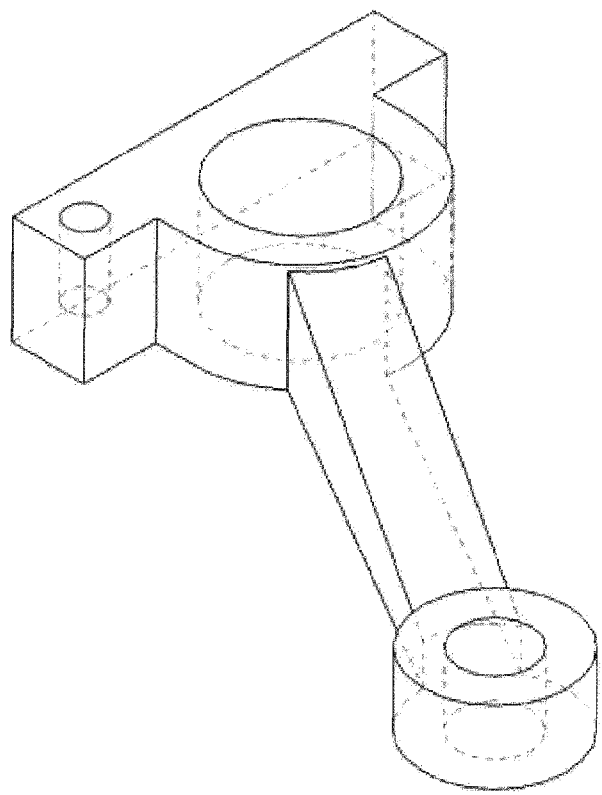
FIG. 7B is an orthogonal projection of a 3D model similar to the one in FIG. 7A, used to describe the comparison process.

FIG. 7B shows another example of 3D models. Table 2 gives the values for the characteristics of its descriptors.

In FIG. 1, s100 is the step for generating the descriptors. All 3D models go through this step, but it can be carried out at different times. Appropriate descriptors can be stored with the 3D model data or separately.

In FIG. 3, 3D models are stored in a data store S30. The data store can be a single data store or a distributed storage of 3D models. A descriptor generator S32 reads the 3D models from the data store S30 and saves the descriptors in a second data store S34. This data store S34 can be integrated with the data store S30, or kept separately, or even remotely.

The system can include a 3D model management system S40 that controls which 3D models will be compared. A reference 3D model selector or generator S42 allows an operator to select or create a reference 3D model. The descriptor of the reference 3D model can be generated using the descriptor generator S32, and embedded in the search engine or comparison engine S50. The S50 engine retrieves the descriptors from the data store S34.

The system in FIG. 3 can be located on an independent workstation, or can be distributed among different computers and/or servers to facilitate processing, storage and data management.

Figure 8B:
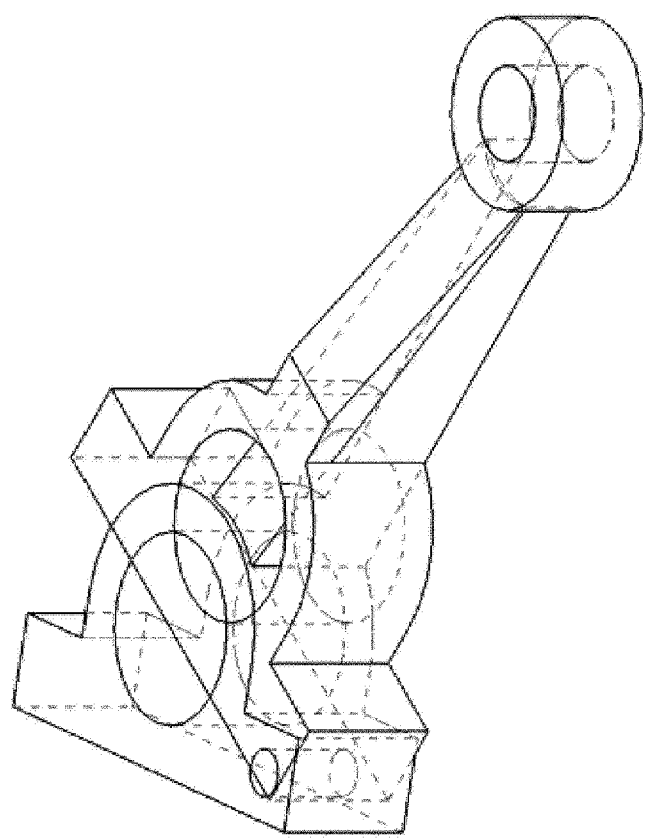
FIG. 8B is an orthogonal projection of the 3D models of FIGS. 7A and 7B, arranged in a second position.
Figure 8A:
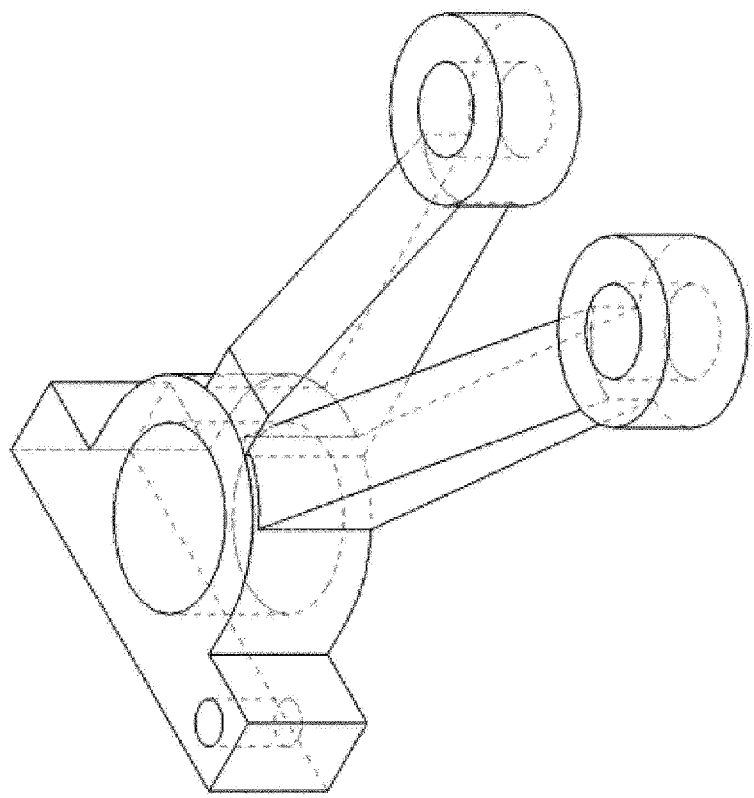
FIG. 8A is an orthogonal projection of the 3D models of FIGS. 7A and 7B, arranged in a first position.

FIG. 8A shows the 3D model of FIG. 5 onto which a second 3D model is superimposed, the second 3D model corresponding to the model of FIG. 7B. This shows the differences with respect to the reference 3D model of FIG. 7A: the median portion is longer (the axial spacing increased from 120 mm to 150 mm), and the median portion connects with the lower portion at an angle which differs by 30 degrees. The 3D model of FIG. 7A is the reference 3D model selected in step S102 of FIG. 1, and the 3D model of 7B is the model with which the reference model is compared in order to explain the process. It is understood that this comparison can be made for each 3D model available.

FIG. 8B shows both 3D models different relative positions. The systems described in the prior art use a single relative position to compare 3D models with one another. This position can be determined either automatically, using the frames of reference specific to each 3D model, by using a best-fit of the two 3D models, or by using an operator. The approach used in the subsequent embodiments determines, using the face characteristics of descriptors, all the relative positions that can match form features (from the subparts of the initial 3D models) of the 3D models being compared.

Even though a comparison between two 3D models at the solid body level can produce useful results for searching purposes, it does not constitute a useful means for retrieving a 3D model embedded in another (more complex) 3D model, which would itself contain one or more parts of the 3D model to which the search is directed. A comparison of the faces allows matching said faces in order to identify 3D models which potentially contain the 3D model being searched for. This matching of faces is obtained through a two-step iterative process of descriptor comparison, comprising a pairing step based on the intrinsic characteristics of the 3D model, for example its area or its moments of inertia, followed by a reconciliation step based on the extrinsic characteristics of the 3D model, for example its center of gravity or its inertial axes. These extrinsic characteristics vary according to the 3D model, and also the frame of reference in which it is described and more generally its context.

The identification (as in the marking) of faces will typically vary among the models being compared. However, in the case of our simplified example, the numbering is identical to facilitate comprehension of the process. Using the intrinsic characteristics of the faces in the descriptor, faces within the 3D models are paired. For example, the characteristic values of area Int(N), perimeter Int(N−1), and of the three moments of inertia M1,2,3 of faces Si,5; Si,6 and Si,4 are unique and identical, thus those faces are paired between two 3D models considered using a maximum confidence index of 1. In contrast, the intrinsic values for faces Si,7; Si,8; Si,16 and Si,17 are not unique and result in a multitude of potential face pairings, for example S1,7 with {S2,7; S2,8; S2,16; S2;17} or S1,9 with {S2,9; S2,25}. The uncertainty will be resolved during the reconciliation step. For faces S1,1; S1,2 and S1,3 with S2,1; S2,2 and S2,3 respectively, the values of intrinsic characteristics are unique but some values vary between faces of the two 3D models being compared. These faces are paired, but the confidence index is lower than 1. The method for calculating this index can vary, and a simple method is proposed herein for aiding with comprehension, the method comprising summing the index given to each characteristic considered and dividing by the number of characteristics considered. For example, for a quantitative parameter, the index amounts to at least the absolute value of the ratio between the difference of the values for that characteristic and their mean, so |(Vref−Vcomp/((Vref+Vcomp)/2)|. For a qualitative parameter, the index can be obtained from a table of values corresponding to the difference cases. This method is given as an example and can be defined otherwise in other embodiments of the process. This index plays a role in the determination of the resemblance index between the 3D models in the present embodiment. In general, the number of faces between two compared 3D models is different and at the end of this step some faces can remain unpaired.

The result of the descriptor comparison following the pairing step for our simplified example following the described embodiment is given in Table 3.

This table shows a comparison between intrinsic characteristics of solid objects that show an imperfect pairing (3D models similar but not identical), followed by a comparison between intrinsic characteristics of faces. Numerous cases are illustrated, such as unique pairings, multiple pairings with identical characteristic values, and pairings based on only partially identical characteristic values and thus with a confidence index below 1. Ambiguities are resolved in a subsequent reconciliation step.

The pairing process was described at the face level for 3D models. It is understood that a similar process can be applied at the level of a plurality of solid objects, if they are present in the 3D models. The pairing is accomplished using their intrinsic characteristics, such as volume (Int(N)), area (Int (N−1)), the three moments of inertia (M1,2,3), with our example of descriptor following the same principle. The process can thus also be used to compare assemblies of 3D models for example, or to find subsystems in more complex systems. As of this step (Step S120 in FIG. 1), the confidence index corresponds to a temporary resemblance index used to increase the computing efficiency of the process.

When a 3D model has an index relative to the reference 3D model which falls under a threshold determined by the operator, it is not necessary to refine the comparison between the descriptors, as the temporary similarity index (of resemblance; step S122 in FIG. 1) gives a quick indication of the 3D models that are potentially similar, thus allowing a large number of 3D models to be considered without going through a finer comparison when it is not necessary.

The pairing compares the 3D models or parts of them, which according to our definition are also 3D models, whether they are faces, sets of faces (form features), one or more solid objects, etc., by analyzing the intrinsic parameters of the descriptor. At this step, each 3D model is considered in an isolated manner without considering its relative position in relation to the other 3D models.

Although the scale of a 3D model can generally be considered as being well defined, and although a low confidence index on dimensional characteristics can be an adequate reason to reject a pairing, it is understood that in certain cases, a scale factor can be determined during the pairing process, and the pairing can be accomplished using a given scale factor.

In FIG. 1, step S124 consists of adding data in the rows of the table for each 3D model compared with the reference 3D model. When a sufficient number of similar 3D models are attained, or when all the available descriptors have been compared, the process of refining the comparison continues instep S126. It is then possible to identify the most similar 3D models based, for example, on the number of paired faces, or the ratio of the total area of paired faces to the sum of the total area of all faces, or any other function which can determine a temporary similarity index. In FIG. 1, the process continues with the reconciliation of the 3D models which are, according to our definition, one or more faces or one or more solid objects. It is then possible to focus on the most promising 3D models.

With reference to FIG. 3, the comparison engine S52 compares descriptors, and the storage of comparison data presented in the tables is done in the store data S54. The engine S50 controls the process and calculates the similarity index.

The reconciliation step S140 of FIG. 1 consists in taking into account the extrinsic characteristics of the descriptors, notably the relative positions of 3D models with respect to one another. Using the definite pairings (confidence index=1), frame-of-reference-changing matrices are determined which reposition compared 3D models into a common frame of reference, for example into the frame of reference of the reference 3D model. The determination of these matrices is rather routine and well-known in the state of the art. At this point, multiple frame-of-reference-changing matrices are created. By applying them to the 3D models, it can be seen that some of them only reconcile models which were used to determine them. They are therefore not very useful, and they are disregarded in step S142.

It is possible to calculate transformations or the frame-of-reference-changing matrices for all the geometrical characteristics of the descriptors (parts of the 3D models, such as faces for example) and then retrieve at least one group of identical transformations (taking into account the computation tolerances). We can also calculate a transformation for a first characteristic (e.g. a first face) and then attempt to apply this transformation to other characteristics. That way, it is possible to develop a group of characteristics sharing a common transformation.

The comparison of extrinsic characteristics is made for each repositioning obtained by applying the retained frame-of-reference-changing matrices (step 144). In the present example, two matrices are retained. A first matrix M1 positions the 3D models as illustrated in FIG. 8A. Faces Si,5; Si,6 and Si,18, which were already paired with certainty, are reconciled and matched, and are declared identical for this specific positioning. By applying this matrix, the pairing ambiguities for faces Si,7; Si,8; Si,9; Si,15; Si,16 and Si, 17 are resolved. These faces are reconciled and are declared identical for this positioning. Finally, by comparing the extrinsic characteristics of the descriptors for faces S1,2 and S1,10 with S2,10 and S2,14 we see that multiple values are identical but others are different. These faces are reconciled with a confidence index lower than 1. They are different and their differences can be qualified using a comparison of the descriptors as will be shown later in the marking step. The second matrix M2 positions the 3D models as illustrated in FIG. 8B. Faces Si,4 and Si,6 are paired with certainty, reconciled, matched and thus are declared identical for this second positioning. Finally, faces Si,11; Si,12 and Si,13 are reconciled with a confidence index lower than 1 and thus have differences for this specific positioning. Depending on the threshold established for the confidence index, a face such as Si,3 is also reconciled. It is also possible that multiple frame-of-reference-changing matrices lead to reconciling faces more than once. In this case, the reconciliation producing the best confidence index is kept. These matrices do not contribute to the resolution of all ambiguities for all cases and some faces remain unpaired. They are usually new faces or heavily modified faces.

For the purposes of the present example, Table 4 has been completed using the data obtained during the reconciliation step. This table can be stored while keeping all the data, or only data of interest for the remaining parts of the process and according to the needs of the operator.

As can be appreciated, the multi-positioning principle introduced as part of the present invention completely redefines the notion of comparing and differentiating 3D models. It permits comparison of parts of the 3D models (form features). Thus, a comparison can be performed using all the repositioning matrices, while prioritizing one or more specific matrices, or even determining one matrix based on certain characteristics of the descriptors selected by the operator. It is understood that in step S146, it is possible to calculate the resemblance index based on these choices.

The comparison data table can then be modified to remove the multiple pairings and ambiguous faces left from the pairing step due to the values of their intrinsic characteristics, and whose irrelevancy became obvious during the reconciliation step (Step S148). Table 5 shows the comparison data post-pruning.

In step S150, the process of refining the comparison continues until a sufficient number of similar 3D models is attained, or all available descriptors have been compared.

It is understood that such a comparison process between 3D models has many applications, such as retrieving similar 3D models, ranking them according to their resemblance index, clustering the 3D models, highlighting identical or different characteristics, or permitting an identification and reconciliation of the references when a 3D model is substituted with a reference 3D model.

The reconciliation engine S56 (see FIG. 3) computes the above-mentioned operation and updates the data in the data store S54.

Figure 10:
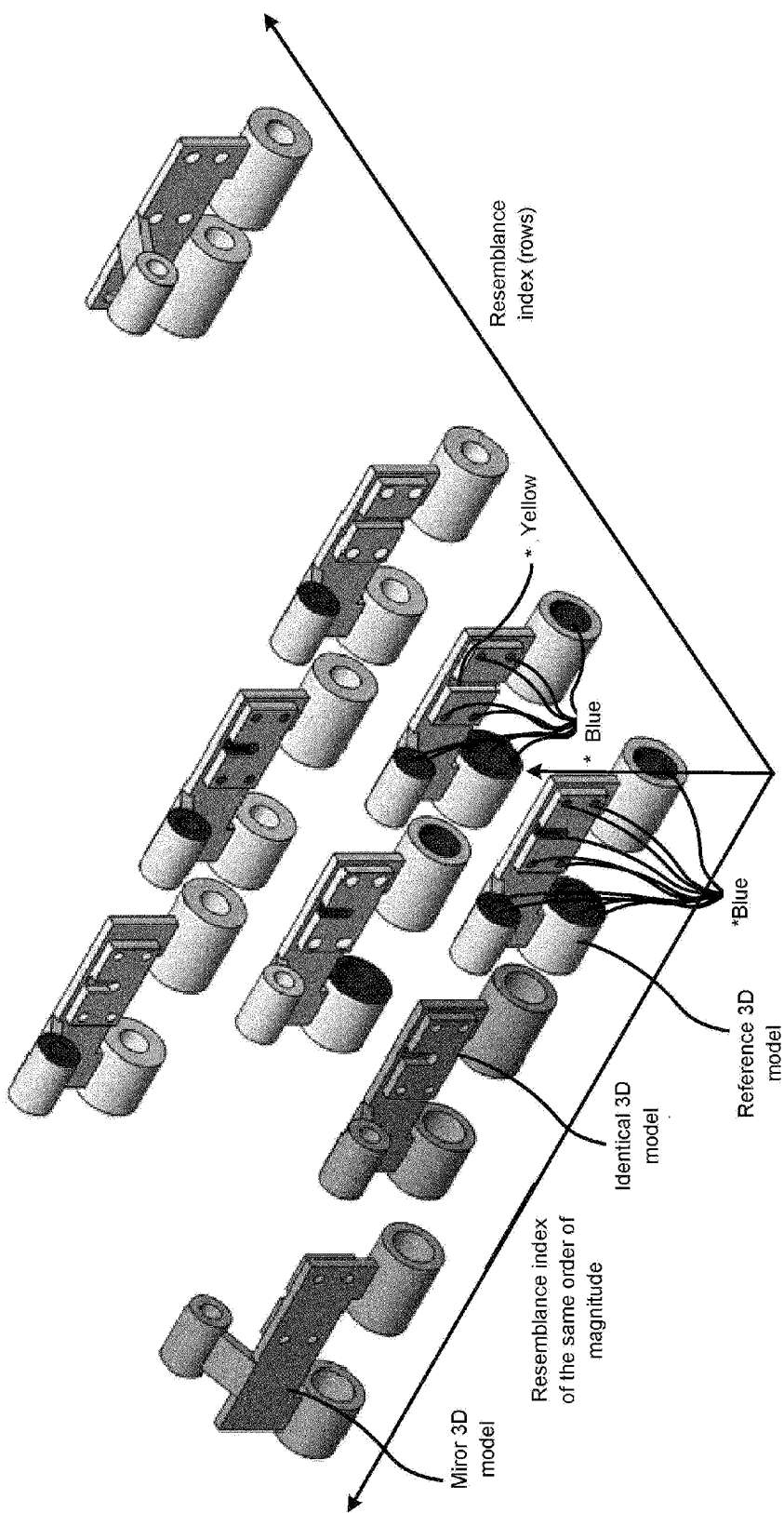
FIG. 10 is an orthogonal projection of a plurality of similar 3D models positioned and marked according to the result of their comparison with the 3D model of reference and the constraints defined by the operator.

Referring to FIG. 3, the 3D models which resemble the reference 3D model most, identified as such by the engine S50 which bases its analysis on the data from the table in the data store S54 which is powered by engines S52 and S56, are now ready to be displayed to the operator using the display system S46. The system S46 generates the desired view of the 3D models. In order to do so, it accesses the 3D models stored in the data store S30 and the marking engine S45 uses the comparison data from the data store S54 to label identical or different faces or other characteristics of the 3D models. The operator selects the desired marking parameters or criteria using interface S44, which also lets the operator select the properties and functions which will determine the position of the 3D models in the 3 dimensional environment generated by the system S46. In some embodiments, S46 uses a CAD system or a web browser to display the results in 3D. The position and the marking of the displayed 3D models vary according to the operator's needs. For example, in some cases, the operator may want to highlight the identical parts of the 3D models in a specific position, or highlight the differences of one or more characteristics. This way of communicating the comparison of numerous 3D models simultaneously, based on the marking and positioning of the 3D models in a 3D environment, as illustrated in FIG. 10, is entirely new and innovative.

It is understood that when the 3D models are compared according to the present process, multiple types of differences between faces, form features and solid objects are identified. The markings distinguish them following the needs of the operator. The following are some examples illustrating the types of differences according to the operator's needs. In a first example, the operator is searching in a set of 3D models for form features identical to those in a reference 3D model, without specifying what they are. In this case, the process goes through pairing, reconciliation, multi repositioning and marks the faces accordingly. Faces Si,4; Si,5; Si,6; Si,7; Si,8; Si,9; Si,15; Si,16; Si,17; Si,18 respectively on the reference 3D model (i=1) and the model being compared (i=2), perfectly match with one another for one of the positions and are marked as being identical (for example by a color, such as blue). Faces Si,1; Si,2; Si,11; Si,13 and faces S1,10; S1,14 with face S2,10 of the 3D models are paired with a low confidence index which increases during reconciliation. These faces are marked as geometrically identical with different topologies (for example using the color green) because they share the same geometrical characteristics (axis and radius for cylindrical faces S1,10; S1,14 and S2,10 and normal and position for flat faces Si,1; Si,2; Si,11; Si,13) but differ on other values of the descriptors characterizing their topology (perimeter for example in our descriptors). The pairing and reconciliation of the descriptors of face Si,13 of the compared 3D models do not permit concluding with high confidence that it is the same modified face. At this stage, there are few faces which are yet to be reconciled, and it is the best remaining choice. In this case, the Type characteristic is identical and depends on the threshold of the confidence index; it will be declared "reconciled and different" (for example in purple) or simply "not reconciled and new" (for example in red). The faces are different both by their geometry and by their topology for all the positions considered. Faces S2,19 and S2,20 are declared "none reconciled", so new (red).

In another example, using the interface 44 (FIG. 3), the operator selects a part of the 3D model (which becomes the de facto reference 3D model) which represents the functional faces or the faces in contact with other components (interfaces), for example such as faces S1,5; S1,1; S1,18 which also serve to define the positioning for the reconciliation step, and also faces S1,6; S1,4. To facilitate the interpretation of the results, it is required that identical faces on the located 3D models be marked in blue, that reconciled and geometrically identical faces with a different topology be marked in cyan, and finally, that the other faces (those which were not considered, not reconciled, or which are new) be gray and transparent. With the 3D models in FIGS. 7A and 7B, S2,5; 52,18 are identical (blue), S2,1; S2,4; S2,6 are geometrically identical (cyan) and all other faces are not considered (transparent gray).

It is understood that the operator, using the appropriate interface 44, can define extremely precise constraints, for example by providing specific requirements for the axial spacing and diameters of faces Si,5 and Si,6, or even for the parallelism and distance between Si,11 and Si,13. All these limitations are computed from the characteristics of the descriptors presented in the present embodiment.

Displaying a 3D model with labels or various textures or colours for particular faces is known in the state of the art.

Differences are shown using colours, transparency, textures, hatching, annotations or any other graphical effect which can be encompassed under the term "marking". Similarities between 3D models, that is to say fewer differences according to the operator's criteria, are represented by their position in the 3D space.

It is understood that a wide range of markings can be used. Thus, similarities are expressed by the respective positions in the 3D space of the 3D models obtained by the function which calculates the resemblance index, but can also be appreciated from the marking of the differences in the 3D models. For example, if a drill hole compared with a drill hole in the reference 3D model has a smaller diameter but its axis is the same, it will be marked a certain way; however, if both its diameter and axis are different, this drilling hole will be marked in a different way to differentiate the two types of differences.

In some embodiments, the process of comparing the descriptors is influenced by the definition of the characteristics of interest, or on the other hand by characteristics which are of no interest. This definition can be specified by the operator explicitly or implicitly. Instep S152 of FIG. 1, the 3D models are selected according to the resemblance index and the criteria expressed by the operator. The results are formatted and displayed instep S160. Among other possible formats, the displaying of 3D models in a 3D space as shown in FIG. 10, with the highlighting of similarities and differences using marking and the spatial positioning of the 3D models as described above, is new and represents the preferred way of communicating results. It is understood that these results can also be transmitted in a text format (table, list, or other format).

Figure 9:
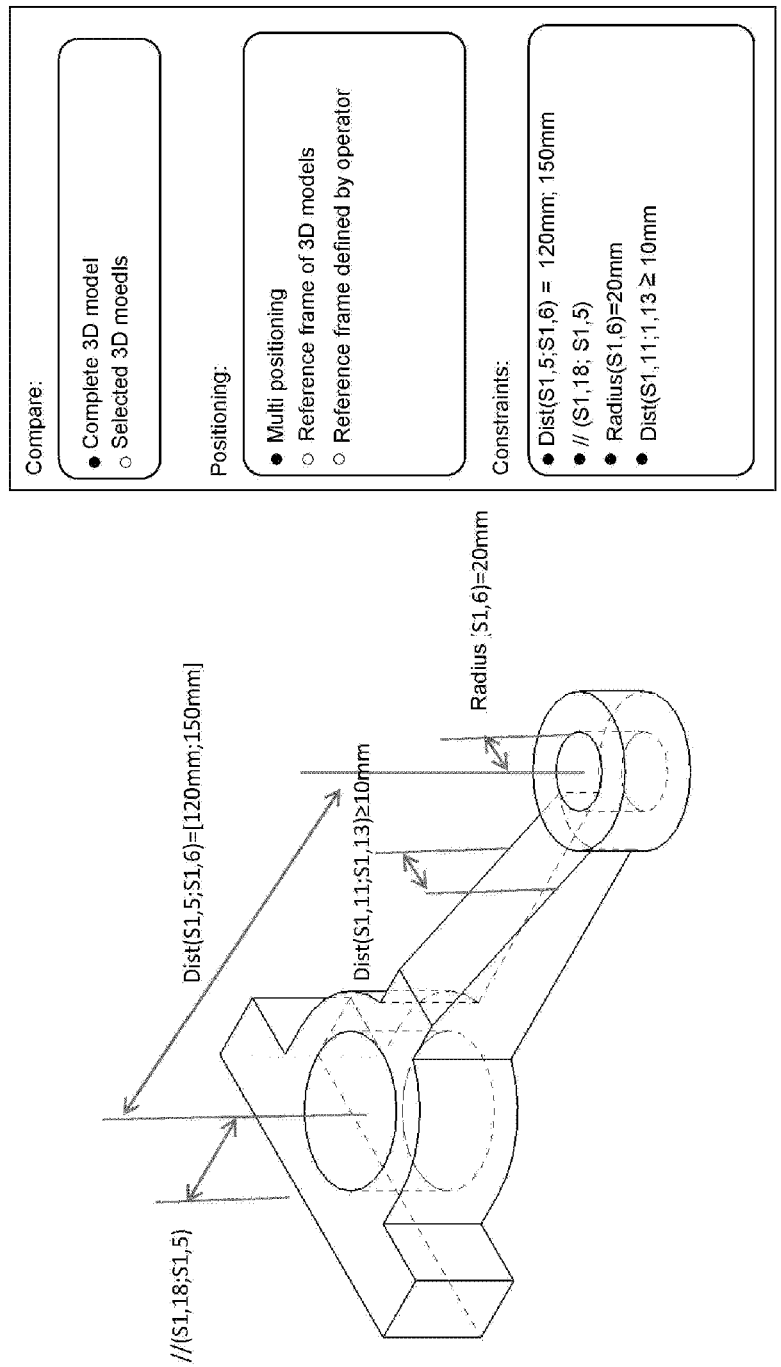
FIG. 9 is an orthogonal projection of the reference 3D model and an interface allowing the operator to define constraints, showing a set of the constraints used in order to describe a specific embodiment.

FIG. 9A shows the simplified 3D model of FIG. 5, and an exemplary interface for defining comparison constraints. In the present case, the complete 3D model is taken into account in the comparison by allowing multi repositioning in order to determine resemblance, and constraints have been imposed such as that the distance between the axes of cylinders Si,5 and Si,6 must be between 120 and 150 mm, that faces Si,18 and Si,5 must be parallel, that Si,6 must have a radius of 20 mm, and finally that the distance between Si,11 and Si,13 must be higher than 10 mm. Determining these constraints can be accomplished notably using a constraint-determining interface S48, as shown in FIG. 3. The operator is able to define if the entire 3D model is to be taken into consideration in the process, or if only a subpart is to be considered. FIG. 2 gives examples of the steps involved in a comparison using the importance given to attributes, such as the models' faces. In this case, the operator selects the subsets of the 3D model to retain (which are also 3D models), and for each subset, the operator indicates if it must be identical or only similar to the 3D models being compared. The operator also chooses whether he authorizes a multi repositioning, or if he imposes a comparison frame of reference, either that of the reference 3D models, or a frame of reference constructed from the constraints he is imposing. Finally, the operator can define constraints to which heat tributes greater importance, such as an axial spacing between 120 and 150 mm for cylinders Si,5 and Si,6, a radius of 20 mm for cylinder S,6 and a distance equal to or greater than 10 mm for faces Si,11 and Si, 13. The operator builds these constraints directly on the explicit characteristics of the descriptors (Radius of Si,6=20 mm), and also on implicit characteristics (Distance between axes Si,5 and Si,6 or parallelism between Si,18 and Si,5). Such implicit characteristics are added to the tables containing the comparison results (additional columns) to be included in the computation of the resemblance index.

This way of defining constraints resembles those offered in CAD systems to constraint sketches and assemblages, and is known in the art.

It is understood that the inventory of available properties and constraints, their selection mode, their layout, and the way in which they are weighed, can be varied in many ways without modifying the underlying functionality. Instead of offering a simple binary selection (distinguishing a "retained/important" selection from a "not retained/not important" one), the interface could, for example, accept a weighed value expressed as an importance percentage or another weighed value. Similarly, the operator can suppress parts of the 3D model he judges insignificant to his request, such as solid objects inferior to a certain dimension (bounding box) or volume, or faces whose area is inferior to a certain percentage of the total area of the 3D model (simplification of the 3D model). It is also possible to limit the comparison by a maximal occupation volume (reservation of space in an assembly).

During the comparison process, constraints, for example such as those expressing the distance between two cylinders, can be used as a filter (Go/No Go), or can be involved only during marking by showing if the constraint is satisfied or not. These constraints eventually play a role in the computation of the resemblance index, which can then be seen as an index of conformity to constraints.

It is understood that when the constraints are modified, the entire process can be repeated from the start, or simply the steps of computing of the resemblance index and the marking of the selected 3D models.

In some embodiments, 3D models are ranked after the comparison process based on the pairing and reconciliation of descriptors according to the computed resemblance index. FIG. 10 illustrates an example of eight 3D models of a hinge piece resembling the reference 3D model (i.e. the 3D model used in the comparison for the purpose of carrying out the present search) positioned in a 3D space (for example, an assemblage in CAD systems) in an isometric view which can be modified by the operator.

The 3D model used as reference is positioned at the origin (bottom right corner), with the blue faces (identified by a *) being taken into account in the marking of the differences after the comparison, and the gray faces (faces not retrieved) not being marked that they are either identical or different in order to facilitate the interpretation of results. Similar 3D models are positioned in the 3D space using criteria associated with the three axes. The marking (colours, textures, transparency, annotations, etc.) can represent other criteria or information. In particular, in the present figure, one of the axes is used to represent a resemblance index. The more a 3D model differs from the reference 3D, the more the distance increases on this axis. 3D models with a resemblance index of the same order of magnitude are grouped along the second axis. Thus, in the first row directly next to the reference model are two 3D models, one identical and the other a mirror image (symmetry plane). In the second row is the only 3D model located which is different, but satisfies all constraints (no yellow faces, thus no faces located in the attached figure). In the next rows are the 3D models which do not satisfy all the constraints and increasingly differ from the reference model. The first 3D model in the third row has a different groove and its faces are marked consequently (in yellow, thus identified by a * in this figure). The next model differs by its four drill holes and bores (all faces are identified by *).

The third axis, not shown in this example, can be used to represent another type of information such as the version, the source, the manufacturing state or any other classification of 3D models of interest to the operator.

The reference 3D model can be derived from an existing scan of a component (part or mechanism), or a 3D model more or less precisely sketched on the screen by the operator. In the latter case, the operator can omit details which nevertheless appear within the 3D models resulting from the search. It is understood that an interface can allow the operator to change from an initial reference model to one of the 3D models in the search results. When the reference 3D model is substituted, the operator can maintain the constraints from the previous comparison or define new ones.

It is understood that the system for comparing 3D models described above can be a powerful tool in the search, analysis or ranking of 3D models. In numerous fields, notably the industrial field, the use of the system and the methods described above can allow to save time throughout the lifecycle of a product, notably during the conception and manufacturing stages.

Figure 11:
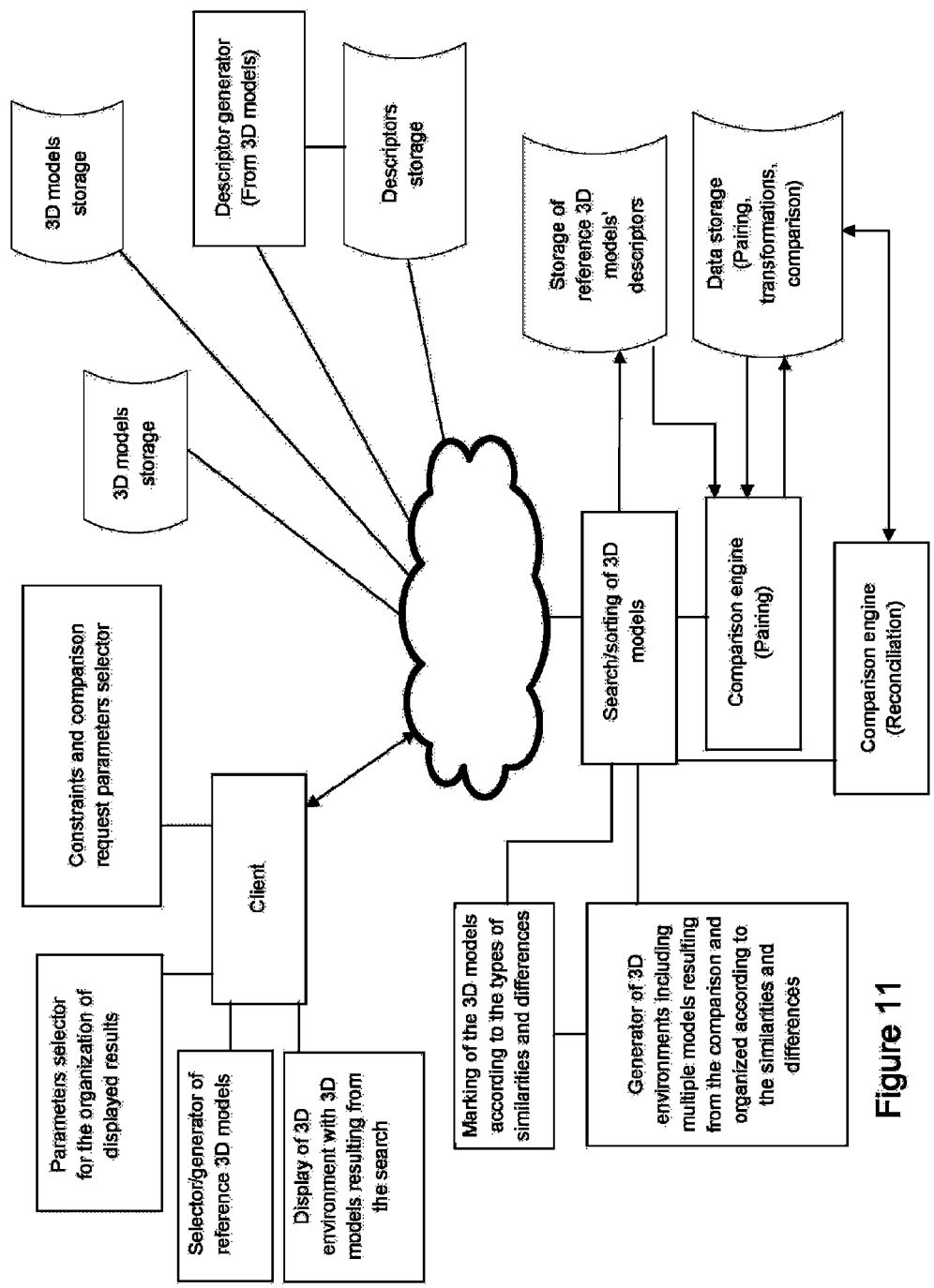
FIG. 11 is a block diagram of a version of the computer system of FIG. 3 having a distributed architecture.

As is illustrated in FIG. 11, the system of FIG. 3 can be deployed in a distributed fashion on more than one computer, on the web or on an intranet, enabling remote access by the operator to the data stores of 3D models, descriptors stores, search and comparison engines, marking engines or any complementary modules. In the example of FIG. 11, the search and comparison tasks are completed on a server remotely from the operator's workstation. The marking engine and 3D rendering engine associated therewith accompany the search server. In another embodiment, the server could also be provided client-side. The 3D environment and the 3D models are sent to the operator for use in a web browser, for example. Likewise, the storage of descriptors is, according to the presently illustration embodiment, hosted remotely. Generating descriptors can constitute a separate service for data stores of 3D models. The system in FIG. 11 also shows three distinct remote data stores of 3D models.

The use of such a system allows an operator of a web browser to search and compare 3D models from a plurality of sources from a single client workstation.

The use of such a system also allows an operator to upload his existing 3D models in order to generate descriptors using a remote service, whether the 3D models are for search and comparison solely by him, or search and comparison by others as well.

TABLE 1

Value of the characteristics of descriptors for the 3D model of FIG. 7A

| Mod.3D | Type | Type_Par | Int N | Int N − 1 | Gx | Gy | Gz | M1 | M2 | M3 |
|---|---|---|---|---|---|---|---|---|---|---|
| 1 | Corps | 18 | 133839 | 29137 | 0 | 26 | 14 | 73210 | 35529 | 411546 |
| 1.1 | Plan | 0; 0; 1; 0 | 5128 | 715.863 | 0.00 | 35.33 | 0.00 | 22053 | 150403 | 172456 |
| 1.2 | Plan | 0; 0; 1; 30 | 2968 | 442.953 | 0.00 | −5.95 | 30.00 | 12304 | 20464 | 32769 |
| 1.3 | plan | 0; .27; .96; 39.8 | 1266 | 171.393 | 0.00 | 70.44 | 21.30 | 427 | 4232 | 4659 |
| 1.4 | plan | 0; 0; 1; 20 | 942 | 188.496 | 0.00 | 120.00 | 20.00 | 1178 | 1178 | 2356 |
| 1.5 | Cyl_int | 0; 0; 0; 0; 0; 1; 20 | 3770 | 251.327 | 0.00 | 0.00 | 15.00 | 10367 | 10367 | 15080 |
| 1.6 | Cyl_int | 0; 120; 0; 0; 0; 1; 10 | 1257 | 125.664 | 0.00 | 120.00 | 10.00 | 1047 | 1047 | 1257 |
| 1.7 | Plan | 1; 0; 0; 50 | 600 | 100 | 50.00 | −20.00 | 15.00 | 200 | 450 | 650 |
| 1.8 | Plan | 0; 1; 0; −10 | 600 | 100 | 40.00 | −10.00 | 15.00 | 200 | 450 | 650 |
| 1.9 | Plan | 1; 0; 0; 30 | 300 | 80 | 30.00 | −5.00 | 15.00 | 25 | 225 | 250 |
| 1.10 | Cyl_ext | 0; 0; 0; 0; 0; 1; 30 | 1108 | 133.858 | 22.98 | 16.25 | 15.00 | 861 | 1197 | 1998 |
| 1.11 | Plan | 1; 0; 0; 10 | 1671 | 193.39 | 10.00 | 60.00 | 11.97 | 824 | 7214 | 8038 |
| 1.12 | Cyl_ext | 0; 120; 0; 0; 0; 1, 20 | 2249 | 275.584 | 0.00 | 122.24 | 10.43 | 4710 | 5686 | 8898 |
| 1.13 | Plan | 1; 0; 0; −10 | 1671 | 193.39 | −10.00 | 60.00 | 11.97 | 824 | 7214 | 8038 |
| 1.14 | Cyl_ext | 0; 0; 0; 0; 0; 1; 30 | 1108 | 133.858 | −22.98 | 16.25 | 15.00 | 861 | 1197 | 1998 |
| 1.15 | Plan | 1; 0; 0; −30 | 300 | 80 | −30.00 | −5.00 | 15.00 | 25 | 225 | 250 |
| 1.16 | Plan | 0; 1; 0; −10 | 600 | 100 | −40.00 | −10.00 | 15.00 | 200 | 450 | 650 |
| 1.17 | Plan | 1; 0; 0; −50 | 600 | 100 | −50.00 | −20.00 | 15.00 | 200 | 450 | 650 |
| 1.18 | Plan | 0; 1; 0; −30 | 3000 | 260 | 0.00 | −30.00 | 15.00 | 2250 | 25000 | 27250 |

TABLE 1-continued

Value of the characteristics of descriptors for the 3D model of FIG. 7A

| Mod.3D | A1x | A1y | A1z | A2x | A2y | A2z | A3x | A3y | A3z | Bx | By | Bz |
|---|---|---|---|---|---|---|---|---|---|---|---|---|
| 1 | 0 | 1 | 0 | −1 | 0 | 0 | 0 | 0 | 1 | 171 | 100 | 33 |
| 1.1 | 0.00 | 1.00 | 0.00 | 1.00 | 0.00 | 0.00 | 0.00 | 0.00 | −1.00 | 170 | 100 | 0 |
| 1.2 | 1.00 | 0.00 | 0.00 | 0.00 | 1.00 | 0.00 | 0.00 | 0.00 | 1.00 | 100 | 70 | 0 |
| 1.3 | 0.00 | 0.96 | −0.28 | −1.00 | 0.00 | 0.00 | 0.00 | 0.28 | 0.96 | 65 | 20 | 0 |
| 1.4 | 1.00 | 0.00 | 0.00 | 0.00 | 1.00 | 0.00 | 0.00 | 0.00 | 1.00 | 40 | 40 | 0 |
| 1.5 | 1.00 | 0.00 | 0.00 | 0.00 | 1.00 | 0.00 | 0.00 | 0.00 | 1.00 | 40 | 40 | 30 |
| 1.6 | 1.00 | 0.00 | 0.00 | 0.00 | 1.00 | 0.00 | 0.00 | 0.00 | 1.00 | 20 | 20 | 20 |
| 1.7 | 0.00 | 0.00 | 1.00 | 0.00 | 1.00 | 0.00 | −1.00 | 0.00 | 0.00 | 30 | 20 | 0 |
| 1.8 | 0.00 | 0.00 | 1.00 | 1.00 | 0.00 | 0.00 | 0.00 | 1.00 | 0.00 | 30 | 20 | 0 |
| 1.9 | 0.00 | 0.00 | 1.00 | 0.00 | 1.00 | 0.00 | −1.00 | 0.00 | 0.00 | 30 | 10 | 0 |
| 1.10 | −0.58 | 0.82 | 0.00 | 0.00 | 0.00 | −1.00 | −0.82 | −0.58 | 0.00 | 35 | 30 | 6 |
| 1.11 | 0.00 | 0.99 | −0.15 | 0.00 | −0.15 | −0.99 | −1.00 | 0.00 | 0.00 | 78 | 31 | 0 |
| 1.12 | 1.00 | 0.00 | 0.00 | 0.00 | −1.00 | 0.07 | 0.00 | −0.07 | −1.00 | 40 | 41 | 22 |
| 1.13 | 0.00 | 0.99 | −0.15 | 0.00 | −0.15 | −0.99 | −1.00 | 0.00 | 0.00 | 78 | 31 | 0 |
| 1.14 | 0.58 | 0.82 | 0.00 | 0.00 | 0.00 | −1.00 | −0.82 | 0.58 | 0.00 | 35 | 30 | 6 |
| 1.15 | 0.00 | 0.00 | 1.00 | 0.00 | 1.00 | 0.00 | −1.00 | 0.00 | 0.00 | 30 | 10 | 0 |
| 1.16 | 0.00 | 0.00 | 1.00 | 1.00 | 0.00 | 0.00 | 0.00 | 1.00 | 0.00 | 30 | 20 | 0 |
| 1.17 | 0.00 | 0.00 | 1.00 | 0.00 | 1.00 | 0.00 | −1.00 | 0.00 | 0.00 | 30 | 20 | 0 |
| 1.18 | 1.00 | 0.00 | 0.00 | 0.00 | 0.00 | 1.00 | 0.00 | −1.00 | 0.00 | 100 | 30 | 0 |

TABLE 2

Value of the characteristic of descriptors for the 3D model of FIG. 7B

| Mod.3D | Type | Type_Par | Int N | Int N − 1 | Gx | Gy | Gz | M1 |
|---|---|---|---|---|---|---|---|---|
| 2 | Corps | 19 | 140437 | 31830 | −54.8 | −99.3 | 13 | 62259 |
| 2.1 | Plan | 0; 0; 1; 0 | 5728 | 775.863 | −48.47 | −88.31 | 0.00 | 19562 |
| 2.2 | Plan | 0; 0; 1; 30 | 2679 | 451.327 | −76.17 | −138.65 | 30.00 | 8411 |
| 2.3 | plan | 0.08; 0.14; 0.98; 8.22 | 2057 | 253.04 | −34.92 | −60.49 | 19.97 | 693 |
| 2.4 | plan | 0; 0; 1; 20 | 942 | 188.496 | 0.00 | 0.00 | 20.00 | 1178 |
| 2.5 | Cyl_int | 0; −75; −129.9; 0; 0; 1; 20 | 3770 | 251.327 | −75.00 | −129.90 | 15.00 | 10367 |
| 2.6 | Cyl_int | 0; 0; 0; 0; 0; 1; 10 | 1257 | 125.664 | 0.00 | 0.00 | 10.00 | 1047 |
| 2.7 | Plan | 1; 0; 0; −25 | 600 | 100 | −25.00 | −149.90 | 15.00 | 200 |
| 2.8 | Plan | 0; 1; 0; −139.9 | 600 | 100 | −35.00 | −139.90 | 15.00 | 200 |
| 2.9 | Plan | 1; 0; 0; −45 | 300 | 80 | −45.00 | −134.90 | 15.00 | 25 |
| 2.10 | Cyl_ext | 0; −75; −129.9; 0; 0; 1; 30 | 2248 | 305.745 | −78.79 | −112.45 | 15.20 | 3748 |
| 2.11 | Plan | 0.866; −0.5; 0; 10 | 2080 | 250.1 | −29.90 | −71.79 | 10.59 | 813 |
| 2.12 | Cyl_ext | 0; 0; 20; 0; 0; 1; 20 | 2272 | 273.793 | 1.01 | 1.76 | 10.45 | 4814 |
| 2.13 | Plan | 0.866; −0.5; 0; −10 | 2080 | 250.1 | −47.22 | −61.79 | 10.59 | 813 |
| 2.15 | Plan | 1; 0; 0; −105 | 300 | 80 | −105.00 | −134.90 | 15.00 | 25 |
| 2.16 | Plan | 0; 1; 0; −139.9 | 600 | 100 | −115.00 | −139.90 | 15.00 | 200 |
| 2.17 | Plan | 1; 0; 0; −125 | 600 | 100 | −125.00 | −149.90 | 15.00 | 200 |
| 2.18 | Plan | 0; 1; 0; −159.9 | 3000 | 260 | −75.00 | −159.90 | 15.00 | 2250 |
| 2.19 | Cyl_int | −35; −149.9; 30; 0; 0; −1; 5 | 628 | 62.832 | −35.00 | −149.90 | 20.00 | 157 |
| 2.20 | Cone_in | −35; −149.9; 10; 0; 0; −1; 5; 2.3 | 91 | 31.416 | −35.00 | −149.90 | 9.04 | 6 |

| Mod.3D | M2 | M3 | A1x | A1y | A1z | A2x | A2y | A2z | A3x | A3y | A3z | Bx | By | Bz |
|---|---|---|---|---|---|---|---|---|---|---|---|---|---|---|
| 2 | 536376 | 581626 | 0.5 | 0.86 | −0.04 | −0.86 | 0.5 | −0.01 | 0.01 | 0.04 | 0.99 | 222 | 97 | 33 |
| 2.1 | 235031 | 254593 | 0.49 | 0.87 | 0.00 | −0.87 | 0.49 | 0.00 | 0.00 | 0.00 | 1.00 | 221 | 97 | 0 |
| 2.2 | 19104 | 27515 | 1.00 | 0.03 | 0.00 | 0.03 | −1.00 | 0.00 | 0.00 | 0.00 | −1.00 | 101 | 62 | 0 |
| 2.3 | 18133 | 18826 | 0.49 | 0.85 | −0.16 | −0.87 | 0.50 | 0.00 | 0.08 | 0.14 | 0.99 | 20 | 20 | 0 |
| 2.4 | 1178 | 2356 | 1.00 | 0.00 | 0.00 | 0.00 | 1.00 | 0.00 | 0.00 | 0.00 | 1.00 | 40 | 40 | 0 |
| 2.5 | 10367 | 15080 | 1.00 | 0.00 | 0.00 | 0.00 | 1.00 | 0.00 | 0.00 | 0.00 | 1.00 | 40 | 40 | 30 |
| 2.6 | 1047 | 1257 | 1.00 | 0.00 | 0.00 | 0.00 | 1.00 | 0.00 | 0.00 | 0.00 | 1.00 | 20 | 20 | 20 |
| 2.7 | 450 | 650 | 0.00 | 0.00 | 1.00 | 0.00 | 1.00 | 0.00 | −1.00 | 0.00 | 0.00 | 30 | 20 | 0 |
| 2.8 | 450 | 650 | 0.00 | 0.00 | 1.00 | 1.00 | 0.00 | 0.00 | 0.00 | 1.00 | 0.00 | 30 | 20 | 0 |
| 2.9 | 225 | 250 | 0.00 | 0.00 | 1.00 | 0.00 | 1.00 | 0.00 | −1.00 | 0.00 | 0.00 | 30 | 10 | 0 |
| 2.10 | 12757 | 13067 | 1.00 | −0.07 | 0.01 | −0.07 | −0.99 | −0.14 | 0.02 | 0.14 | −0.99 | 60 | 36 | 34 |
| 2.11 | 17814 | 18627 | 0.50 | 0.86 | −0.09 | −0.04 | −0.08 | −1.00 | −0.87 | 0.50 | 0.00 | 106 | 29 | 0 |
| 2.12 | 5693 | 9009 | 0.87 | −0.50 | 0.00 | −0.50 | −0.86 | 0.07 | −0.03 | −0.06 | −1.00 | 40 | 41 | 22 |
| 2.13 | 17814 | 18627 | 0.50 | 0.86 | −0.09 | −0.04 | −0.08 | −1.00 | −0.87 | 0.50 | 0.00 | 106 | 29 | 0 |
| 2.15 | 225 | 250 | 0.00 | 0.00 | 1.00 | 0.00 | 1.00 | 0.00 | −1.00 | 0.00 | 0.00 | 30 | 10 | 0 |
| 2.16 | 450 | 650 | 0.00 | 0.00 | 1.00 | 1.00 | 0.00 | 0.00 | 0.00 | 1.00 | 0.00 | 30 | 20 | 0 |
| 2.17 | 450 | 650 | 0.00 | 0.00 | 1.00 | 0.00 | 1.00 | 0.00 | −1.00 | 0.00 | 0.00 | 30 | 20 | 0 |
| 2.18 | 25000 | 27250 | 1.00 | 0.00 | 0.00 | 0.00 | 0.00 | 1.00 | 0.00 | −1.00 | 0.00 | 100 | 30 | 0 |
| 2.19 | 288 | 288 | 0.00 | 0.00 | 1.00 | 0.00 | 1.00 | 0.00 | −1.00 | 0.00 | 0.00 | 20 | 10 | 10 |
| 2.20 | 6 | 11 | 1.00 | 0.00 | 0.00 | 0.00 | 1.00 | 0.00 | 0.00 | 0.00 | 1.00 | 10 | 10 | 3 |

TABLE 3

| | | Post-pairing results of the 3D models | | | | | | | |
|---|---|---|---|---|---|---|---|---|---|
| Mod.3D | Type | Int N | Int N − 1 | M1 | M2 | M3 | Bx | By | Bz | Indice App. |
| 1 | Corps | 133839 | 29137 | 73210 | 35529 | 411546 | 171 | 100 | 33 | |
| 2 | Corps | 140437 | 31830 | 62259 | 536376 | 581626 | 222 | 97 | 33 | |
| Indice | 1.00 | 0.98 | 0.96 | 0.92 | 0.12 | 0.83 | 0.87 | 0.98 | 0.99 | 0.85 |
| 1.1 | Plan | 5128 | 716 | 22053 | 150403 | 172456 | 170 | 100 | 0 | |
| 2.1 | Plan | 5728 | 776 | 19562 | 235031 | 254593 | 221 | 97 | 0 | |
| Indice | 1.00 | 0.94 | 0.96 | 0.94 | 0.78 | 0.81 | 0.87 | 0.98 | 1.00 | 0.92 |
| 1.2 | Plan | 2968 | 443 | 12304 | 20464 | 32769 | 100 | 70 | 0 | |
| 2.1 | Plan | 5728 | 776 | 19562 | 235031 | 254593 | 221 | 97 | 0 | |
| Indice | 1.00 | 0.68 | 0.73 | 0.77 | 0.16 | 0.23 | 0.62 | 0.84 | 1.00 | 0.67 |
| 1.3 | plan | 1266 | 171 | 427 | 4232 | 4659 | 65 | 20 | 0 | |
| 2.3 | plan | 2057 | 253 | 693 | 18133 | 18826 | 106 | 20 | 0 | |
| Indice | 1.00 | 0.76 | 0.81 | 0.76 | 0.38 | 0.40 | 0.76 | 1.00 | 0.87 | 0.75 |
| 1.4 | plan | 942 | 188 | 1178 | 1178 | 2356 | 40 | 40 | 0 | |
| 2.4 | plan | 942 | 188 | 1178 | 1178 | 2356 | 40 | 40 | 0 | |
| Indice | 1.00 | 1.00 | 1.00 | 1.00 | 1.00 | 1.00 | 1.00 | 1.00 | 1.00 | 1.00 |
| 1.5 | Cyl_int | 3770 | 251 | 10367 | 10367 | 15080 | 40 | 40 | 30 | |
| 2.5 | Cyl_int | 3770 | 251 | 10367 | 10367 | 15080 | 40 | 40 | 30 | |
| Indice | 1.00 | 1.00 | 1.00 | 1.00 | 1.00 | 1.00 | 1.00 | 1.00 | 1.00 | 1.00 |
| 1.6 | Cyl_int | 1257 | 126 | 1047 | 1047 | 1257 | 20 | 20 | 20 | |
| 2.6 | Cyl_nt | 1257 | 126 | 1047 | 1047 | 1257 | 20 | 20 | 20 | |
| Indice | 1.00 | 1.00 | 1.00 | 1.00 | 1.00 | 1.00 | 1.00 | 1.00 | 1.00 | 1.00 |
| 1.7 | Plan | 600 | 100 | 200 | 450 | 650 | 30 | 20 | 0 | |
| 2.7 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.8 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.16 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.17 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 1.8 | Plan | 600 | 100 | 200 | 450 | 650 | 30 | 20 | 0 | |
| 2.7 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.8 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.16 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.17 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 1.9 | Plan | 300 | 80 | 25 | 225 | 250 | 30 | 10 | 0 | |
| 2.9 | Plan | 300 | 80 | 25 | 225 | 250 | 30 | 10 | 0 | |
| Indice | 1.00 | 1.00 | 1.00 | 1.00 | 1.00 | 1.00 | 1.00 | 1.00 | 1.00 | 1.00 |
| 2.15 | Plan | 300 | 80 | 25 | 225 | 250 | 30 | 10 | 0 | |
| Indice | 1.00 | 1.00 | 1.00 | 1.00 | 1.00 | 1.00 | 1.00 | 1.00 | 1.00 | 1.00 |
| 1.10 | Cyl_ext | 1108 | 134 | 861 | 1197 | 1998 | 35 | 30 | 6 | |
| 2.10 | Cyl_ext | 2248 | 306 | 3748 | 12757 | 13067 | 60 | 36 | 34 | |
| Indice | 1.00 | 0.66 | 0.61 | 0.37 | 0.17 | 0.27 | 0.73 | 0.91 | 0.28 | 0.56 |
| 1.11 | Plan | 1671 | 193 | 824 | 7214 | 8038 | 78 | 31 | 0 | |
| 2.11 | Plan | 2080 | 250 | 813 | 17814 | 18627 | 106 | 29 | 0 | |
| Indice | 1.00 | 0.89 | 0.87 | 0.99 | 0.58 | 0.60 | 0.85 | 0.95 | 0.00 | 0.75 |
| 2.13 | Plan | 2080 | 250 | 813 | 17814 | 18627 | 106 | 29 | 0 | |
| Indice | 1.00 | 0.89 | 0.87 | 0.99 | 0.58 | 0.60 | 0.85 | 0.95 | 0.00 | 0.75 |
| 1.12 | Cyl_ext | 2249 | 276 | 4710 | 5686 | 8898 | 40 | 41 | 22 | |
| 2.12 | Cyl_ext | 2272 | 274 | 4814 | 5693 | 9009 | 40 | 41 | 22 | |
| Indice | 1.00 | 0.99 | 1.00 | 0.99 | 1.00 | 0.99 | 1.00 | 1.00 | 1.00 | 1.00 |
| 1.13 | Plan | 1671 | 193 | 824 | 7214 | 8038 | 78 | 31 | 0 | |
| 2.11 | Plan | 2080 | 250 | 813 | 17814 | 18627 | 106 | 29 | 0 | |
| Indice | 1.00 | 0.89 | 0.87 | 0.99 | 0.58 | 0.60 | 0.85 | 0.95 | 0.00 | 0.75 |
| 2.13 | Plan | 2080 | 250 | 813 | 17814 | 18627 | 106 | 29 | 0 | |
| Indice | 1.00 | 0.89 | 0.87 | 0.99 | 0.58 | 0.60 | 0.85 | 0.95 | 0.00 | 0.75 |
| 1.14 | Cyl_ext | 1108 | 134 | 861 | 1197 | 1998 | 35 | 30 | 6 | |
| 2.10 | Cyl_ext | 2248 | 306 | 3748 | 12757 | 13067 | 60 | 36 | 34 | |
| Indice | 1.00 | 0.66 | 0.61 | 0.37 | 0.17 | 0.27 | 0.73 | 0.91 | 0.28 | 0.56 |
| 1.15 | Plan | 300 | 80 | 25 | 225 | 250 | 30 | 10 | 0 | |
| 2.9 | Plan | 300 | 80 | 25 | 225 | 250 | 30 | 10 | 0 | |
| Indice | 1.00 | 1.00 | 1.00 | 1.00 | 1.00 | 1.00 | 1.00 | 1.00 | 1.00 | 1.00 |
| 2.15 | Plan | 300 | 80 | 25 | 225 | 250 | 30 | 10 | 0 | |
| Indice | 1.00 | 1.00 | 1.00 | 1.00 | 1.00 | 1.00 | 1.00 | 1.00 | 1.00 | 1.00 |
| 1.16 | Plan | 600 | 100 | 200 | 450 | 650 | 30 | 20 | 0 | |
| 2.7 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.8 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.16 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.17 | Plan | 600 | 100 | 200 | 450 | 650 | 30 | 20 | 0 | |

TABLE 3-continued

Post-pairing results of the 3D models

| Mod.3D | Type | Int N | Int N − 1 | M1 | M2 | M3 | Bx | By | Bz | Indice App. |
|---|---|---|---|---|---|---|---|---|---|---|
| Indice | 1.00 | 1.00 | 1.00 | 1.00 | 1.00 | 1.00 | 1.00 | 1.00 | 1.00 | 1.00 |
| 1.17 | Plan | 600 | 100 | 200 | 450 | 650 | 30 | 20 | 0 | |
| 2.7 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.8 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.16 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 2.17 | Plan | 600 | 100 | 200 | 450 | 650 | 30 | 20 | 0 | |
| Indice | 1.00 | 1.00 | 1.00 | 1.00 | 1.00 | 1.00 | 1.00 | 1.00 | 1.00 | 1.00 |
| 1.18 | Plan | 3000 | 260 | 2250 | 25000 | 27250 | 100 | 30 | 0 | |
| 2.18 | Plan | 3000 | 260 | 2250 | 25000 | 27250 | 100 | 30 | 0 | |
| Indice | 1.00 | 1.00 | 1.00 | 1.00 | 1.00 | 1.00 | 1.00 | 1.00 | 1.00 | 1.00 |
| 1.— | — | — | — | — | — | — | — | — | — | |
| 2.19 | Cyl_int | 628 | 63 | 157 | 288 | 288 | 20 | 10 | 10 | |
| Indice | 0.00 | 0.00 | 0.00 | 0.00 | 0.00 | 0.00 | 0.00 | 0.00 | 0.00 | 0.00 |
| 1.— | — | — | — | — | — | — | — | — | — | |
| 2.20 | Cone_int | 91 | 31 | 6 | 6 | 11 | 10 | 10 | 3 | |
| Indice | 0.00 | 0.00 | 0.00 | 0.00 | 0.00 | 0.00 | 0.00 | 0.00 | 0.00 | |

TABLE 4

Post-pairing and post-reconciliation results of the 3D models

| Mod.3D | Type | Type_Par | Gx | Gy | Gz | A1x | A1y | A1z | A2x | A2y | A2z | A3x | A3y | A3z | Matrics | Indice |
|---|---|---|---|---|---|---|---|---|---|---|---|---|---|---|---|---|
| 1 | Corps | 18 | 0.00 | 25.80 | 13.60 | 0.00 | 1.00 | 0.04 | −1.00 | 0.00 | 0.00 | 0.00 | 0.04 | 1.00 | | |
| 2 | Corps | 19 | 2.147 | 6.539 | 13.002 | 0.00 | 1.00 | −0.04 | −1.00 | 0.00 | −0.01 | −0.01 | 0.04 | 0.99 | 2 | |
| Indice | 1 | 0.97 | 0.98 | 0.91 | 0.98 | 1.00 | 1.00 | 0.94 | 1.00 | 1.00 | 1.00 | 1.00 | 1.00 | 1.00 | | 0.98 |
| 1.1 | Plan | 0; 0; 1; 0 | 0.00 | 35.33 | 0.00 | 0.00 | 1.00 | 0.00 | 1.00 | 0.00 | 0.00 | 0.00 | 0.00 | −1.00 | | |
| 2.1 | Plan | 0; 0; 1; 0 | 2.18 | 19.29 | 0.00 | −0.01 | 1.00 | 0.00 | −1.00 | −0.01 | 0.00 | 0.00 | 0.00 | 1.00 | 2 | |
| Indice | 1 | 1.00 | 0.98 | 0.92 | 1.00 | 0.99 | 1.00 | 1.00 | 0.00 | 1.00 | 1.00 | 1.00 | 1.00 | 0.00 | | 0.85 |
| 1.2 | Plan | 0; 0; 1; 30 | 0.00 | −5.95 | 30.00 | 1.00 | 0.00 | 0.00 | 0.00 | 1.00 | 0.00 | 0.00 | 0.00 | 1.00 | | |
| 2.2 | Plan | 0; 0; 1; 30 | −1.17 | −8.75 | 30.00 | 1.00 | 0.03 | 0.00 | 0.03 | −1.00 | 0.00 | 0.00 | 0.00 | −1.00 | 1 | |
| Indice | 1 | 1.00 | 0.99 | 0.99 | 1.00 | 1.00 | 0.98 | 1.00 | 0.98 | 1.00 | 1.00 | 1.00 | 1.00 | 0.00 | | 0.85 |
| 1.3 | plan | 0; 27; 96; 39.8 | 0.00 | 70.44 | 21.30 | 0.00 | 0.96 | −0.28 | −1.00 | 0.00 | 0.00 | 0.00 | 0.28 | 0.96 | | |
| 2.3 | plan | 0; 0.164; 0.986; 27.948 | 0.00 | 50.15 | 19.97 | 0.00 | 0.99 | −0.16 | −1.00 | 0.00 | 0.00 | 0.00 | 0.16 | 0.99 | 2 | |
| Indice | 1 | 0.00 | 1.00 | 0.90 | 0.96 | 1.00 | 0.98 | 0.91 | 1.00 | 1.00 | 1.00 | 1.00 | 0.94 | 0.99 | | 0.91 |
| 1.4 | plan | 0; 0; 1; 20 | 0.00 | 120.00 | 20.00 | 1.00 | 0.00 | 0.00 | 0.00 | 1.00 | 0.00 | 0.00 | 0.00 | 1.00 | | |
| 2.4 | plan | 0; 0; 1; 20 | 0.00 | 120.00 | 20.00 | 1.00 | 0.00 | 0.00 | 0.00 | 1.00 | 0.00 | 0.00 | 0.00 | 1.00 | | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | 2 | 1.00 |
| 1.5 | Cyl_int | 0; 0; 0; 0; 0; 1; 20 | 0.00 | 0.00 | 15.00 | 1.00 | 0.00 | 0.00 | 0.00 | 1.00 | 0.00 | 0.00 | 0.00 | 1.00 | | |
| 2.5 | Cyl_int | 0; 0; 0; 0; 0; 1; 20 | 0.00 | 0.00 | 15.00 | 1.00 | 0.00 | 0.00 | 0.00 | 1.00 | 0.00 | 0.00 | 0.00 | 1.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.6 | Cyl_int | 0; 120; 0; 0; 0; 1; 10 | 0.00 | 120.00 | 10.00 | 1.00 | 0.00 | 0.00 | 0.00 | 1.00 | 0.00 | 0.00 | 0.00 | 1.00 | | |
| 2.6 | Cyl_int | 0; 120; 0; 0; 0; 1; 10 | 0.00 | 120.00 | 10.00 | 1.00 | 0.00 | 0.00 | 0.00 | 1.00 | 0.00 | 0.00 | 0.00 | 1.00 | 2 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.7 | Plan | 1; 0; 0; 50 | 50.00 | −20.00 | 15.00 | 0.00 | 0.00 | 1.00 | 0.00 | 1.00 | 0.00 | −1.00 | 0.00 | 0.00 | | |
| 2.7 | Plan | 1; 0; 0; 50 | 50.00 | −20.00 | 15.00 | 0.00 | 0.00 | 1.00 | 0.00 | 1.00 | 0.00 | −1.00 | 0.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.8 | Plan | 0; 1; 0; −10 | 40.00 | −10.00 | 15.00 | 0.00 | 0.00 | 1.00 | 1.00 | 0.00 | 0.00 | 0.00 | 1.00 | 0.00 | | |
| 2.8 | Plan | 0; 1; 0; −10 | 40.00 | −10.00 | 15.00 | 0.00 | 0.00 | 1.00 | 1.00 | 0.00 | 0.00 | 0.00 | 1.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.9 | Plan | 1; 0; 0; 30 | 30.00 | −5.00 | 15.00 | 0.00 | 0.00 | 1.00 | 0.00 | 1.00 | 0.00 | 0.00 | −1.00 | 0.00 | | |
| 2.9 | Plan | 1; 0; 0; 30 | 30.00 | −5.00 | 15.00 | 0.00 | 0.00 | 1.00 | 0.00 | 1.00 | 0.00 | −1.00 | 0.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.10 | Cyl_ext | 0; 0; 0; 0; 0; 1; 30 | 22.98 | 16.25 | 15.00 | −0.58 | 0.82 | 0.00 | 0.00 | 0.00 | −1.00 | −0.82 | −0.58 | 0.00 | | |
| 2.10 | Cyl_ext | 0; 0; 0; 0; 0; 1; 30 | −3.79 | 17.45 | 15.20 | 1.00 | −0.07 | 0.01 | −0.07 | −0.99 | −0.14 | 0.02 | 0.14 | −0.99 | 1 | |
| Indice | 1 | 1.00 | 0.79 | 0.99 | 0.99 | 0.00 | 0.41 | 0.99 | 0.97 | 0.51 | 0.57 | 0.55 | 0.64 | 0.51 | | 0.71 |
| 1.11 | Plan | 1; 0; 0; 10 | 10.00 | 60.00 | 11.97 | 0.00 | 0.99 | −0.15 | 0.00 | −0.15 | −0.99 | −1.00 | 0.00 | 0.00 | | |
| 2.11 | Plan | 1; 0; 0; 10 | 10.00 | 42.88 | 10.59 | 0.00 | 1.00 | −0.09 | 0.00 | −0.09 | −1.00 | −1.00 | 0.00 | 0.00 | 2 | |
| Indice | 1 | 1.00 | 1.00 | 0.92 | 0.95 | 1.00 | 1.00 | 0.95 | 1.00 | 0.97 | 1.00 | 1.00 | 1.00 | 1.00 | | 0.98 |
| 1.12 | Cyl_ext | 0; 120; 0; 0; 0; 1; 20 | 0.00 | 122.24 | 10.43 | 1.00 | 0.00 | 0.00 | 0.00 | −1.00 | 0.07 | 0.00 | −0.07 | −1.00 | | |
| 2.12 | Cyl_ext | 0; 120; 0; 0; 0; 1; 20 | 0.00 | 122.03 | 10.45 | 1.00 | 0.00 | 0.00 | 0.00 | −1.00 | 0.07 | 0.00 | −0.07 | −1.00 | 2 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.13 | Plan | 1; 0; 0; −10 | −10.00 | 60.00 | 11.97 | 0.00 | 0.99 | −0.15 | 0.00 | −0.15 | −0.99 | −1.00 | 0.00 | 0.00 | | |
| 2.13 | Plan | 1; 0; 0; −10 | −10.00 | 42.88 | 10.59 | 0.00 | 1.00 | −0.09 | 0.00 | −0.09 | −1.00 | −1.00 | 0.00 | 0.00 | 2 | |
| Indice | 1 | 1.00 | 1.00 | 0.92 | 0.95 | 1.00 | 1.00 | 0.95 | 1.00 | 0.97 | 1.00 | 1.00 | 1.00 | 1.00 | | 0.98 |
| 1.14 | Cyl_ext | 0; 0; 0; 0; 0; 1; 30 | −22.98 | 16.25 | 15.00 | 0.58 | 0.82 | 0.00 | 0.00 | 0.00 | −1.00 | −0.82 | 0.58 | 0.00 | | |
| 2.10 | Cyl_ext | 0; 0; 0; 0; 0; 1; 30 | −3.79 | 17.45 | 15.20 | 1.00 | −0.07 | 0.01 | −0.07 | −0.99 | −0.14 | 0.02 | 0.14 | −0.99 | 1 | |
| Indice | 1 | 1.00 | 0.85 | 0.99 | 0.99 | 0.73 | 0.41 | 0.99 | 0.97 | 0.51 | 0.57 | 0.55 | 0.78 | 0.51 | | 0.78 |

TABLE 4-continued

Post-pairing and post-reconciliation results of the 3D models

| Mod.3D | Type | Type_Par | Gx | Gy | Gz | A1x | A1y | A1z | A2x | A2y | A2z | A3x | A3y | A3z | Matrices | Indice |
|---|---|---|---|---|---|---|---|---|---|---|---|---|---|---|---|---|
| 1.15 | Plan | 1; 0; 0; −30 | −30.00 | −5.00 | 15.00 | 0.00 | 0.00 | 1.00 | 0.00 | 1.00 | 0.00 | −1.00 | 0.00 | 0.00 | | |
| 2.15 | Plan | 1; 0; 0; −30 | −30.00 | −5.00 | 15.00 | 0.00 | 0.00 | 1.00 | 0.00 | 1.00 | 0.00 | −1.00 | 0.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.16 | Plan | 0; 1; 0; −10 | −40.00 | −10.00 | 15.00 | 0.00 | 0.00 | 1.00 | 1.00 | 0.00 | 0.00 | 0.00 | 1.00 | 0.00 | | |
| 2.16 | Plan | 0; 1; 0; −10 | −40.00 | −10.00 | 15.00 | 0.00 | 0.00 | 1.00 | 1.00 | 0.00 | 0.00 | 0.00 | 1.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.18 | Plan | 0; 1; 0; −30 | 0.00 | −30.00 | 15.00 | 1.00 | 0.00 | 0.00 | 0.00 | 0.00 | 1.00 | 0.00 | −1.00 | 0.00 | | |
| 2.18 | Plan | 0; 1; 0; −30 | 0.00 | −30.00 | 15.00 | 1.00 | 0.00 | 0.00 | 0.00 | 0.00 | 1.00 | 0.00 | −1.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |

TABLE 5

Pruned post-pairing and post-reconciliation results of 3D models (not final)

| Mod.3D | Type | Type_Par | Gx | Gy | Gz | A1x | A1y | A1z | A2x | A2y | A2z | A3x | A3y | A3z | Matrice | Indice |
|---|---|---|---|---|---|---|---|---|---|---|---|---|---|---|---|---|
| 1 | Corps | 18 | 0.00 | 25.80 | 13.80 | 0.00 | 1.00 | 0.04 | −1.00 | 0.00 | 0.00 | 0.00 | 0.04 | 1.00 | | |
| 2 | Corps | 19 | 20.129 | 30.57 | 13.002 | 0.5 | 0.87 | −0.04 | −0.88 | 0.5 | −0.01 | 0.01 | 0.04 | 0.99 | 1 | |
| Indice | 1 | 0.97 | 0.84 | 0.98 | 0.98 | 0.68 | 0.91 | 0.93 | 0.94 | 0.75 | 1.00 | 0.99 | 1.00 | 1.00 | | 0.93 |
| 2 | Corps | 19 | 2.147 | 6.539 | 13.002 | 0.00 | 1.00 | −0.04 | −1.00 | 0.00 | −0.01 | −0.01 | 0.04 | 0.99 | 2 | |
| Indice | 1 | 0.97 | 0.98 | 0.91 | 0.98 | 1.00 | 1.00 | 0.94 | 1.00 | 1.00 | 1.00 | 1.00 | 1.00 | 1.00 | | 0.98 |
| 1.1 | Plan | 0; 0; 1; 0 | 0.00 | 35.33 | 0.00 | 0.00 | 1.00 | 0.00 | 1.00 | 0.00 | 0.00 | 0.00 | 0.00 | −1.00 | | |
| 2.1 | Plan | 0; 0; 1; 0 | 26.53 | 41.59 | 0.00 | 0.49 | 0.87 | 0.00 | −0.87 | 0.49 | 0.00 | 0.00 | 0.00 | 1.00 | 1 | |
| Indice | 1 | 1.00 | 0.79 | 0.97 | 1.00 | 0.69 | 0.91 | 1.00 | 0.06 | 0.75 | 1.00 | 1.00 | 1.00 | 0.00 | | 0.80 |
| 2.1 | Plan | 0; 0; 1; 0 | 2.18 | 19.29 | 0.00 | −0.01 | 1.00 | 0.00 | −1.00 | −0.01 | 0.00 | 0.00 | 0.00 | 1.00 | 2 | |
| Indice | 1 | 1.00 | 0.98 | 0.92 | 1.00 | 0.99 | 1.00 | 1.00 | 1.00 | 1.00 | 1.00 | 1.00 | 1.00 | 0.00 | | 0.85 |
| 1.2 | Plan | 0; 0; 1; 30 | 0.00 | −5.95 | 30.00 | 1.00 | 0.00 | 0.00 | 0.00 | 1.00 | 0.00 | 0.00 | 0.00 | 1.00 | | |
| 2.2 | Plan | 0; 0; 1; 30 | −1.17 | −8.75 | 30.00 | 1.00 | 0.03 | 0.00 | 0.08 | −1.00 | 0.00 | 0.00 | 0.00 | −1.00 | 1 | |
| Indice | 1 | 1.00 | 0.99 | 0.89 | 1.00 | 1.00 | 0.98 | 1.00 | 0.98 | 1.00 | 1.00 | 1.00 | 1.00 | 0.00 | | 0.85 |
| 2.2 | Plan | 0; 0; 1; 30 | 3.36 | −38.16 | 30.00 | 0.85 | 0.53 | 0.00 | 0.53 | −0.85 | 0.00 | 0.00 | 0.00 | −1.00 | 2 | |
| Indice | 1 | 1.00 | 0.97 | 0.84 | 1.00 | 0.90 | 0.65 | 1.00 | 0.74 | 0.02 | 1.00 | 1.00 | 1.00 | 0.00 | | 0.80 |
| 1.3 | plan | 0; 27; 96; 39.8 | 0.00 | 70.44 | 21.30 | 0.00 | 0.96 | −0.28 | −1.00 | 0.00 | 0.00 | 0.00 | 0.28 | 0.96 | | |
| 2.3 | plan | 0.08; 0.14; 0.98; 32.88 | 40.08 | 69.42 | 19.97 | 0.49 | 0.85 | −0.16 | −0.87 | 0.50 | 0.00 | 0.08 | 0.14 | 0.99 | 1 | |
| Indice | 1 | 0.00 | 0.68 | 0.99 | 0.96 | 0.69 | 0.93 | 0.91 | 0.93 | 0.75 | 1.00 | 0.96 | 0.93 | 0.99 | | 0.84 |
| 2.3 | plan | 0; 0.164; 0.986; 27.948 | 0.00 | 50.15 | 19.97 | 0.00 | 0.99 | −0.16 | −1.00 | 0.00 | 0.00 | 0.00 | 0.16 | 0.99 | 2 | |
| Indice | 1 | 0.00 | 1.00 | 0.90 | 0.96 | 1.00 | 0.98 | 0.91 | 1.00 | 1.00 | 1.00 | 1.00 | 0.94 | 0.99 | | 0.91 |
| 1.4 | plan | 0; 0; 1; 20 | 0.00 | 120.00 | 20.00 | 1.00 | 0.00 | 0.00 | 0.00 | 1.00 | 0.00 | 0.00 | 0.00 | 1.00 | | |
| 2.4 | plan | 0; 0; 1; 20 | 75.00 | 129.90 | 20.00 | 1.00 | 0.00 | 0.00 | 0.00 | 1.00 | 0.00 | 0.00 | 0.00 | 1.00 | 1 | |
| Indice | 1 | 1.00 | 0.40 | 0.95 | 1.00 | 1.00 | 1.00 | 1.00 | 1.00 | 1.00 | 1.00 | 1.00 | 1.00 | 1.00 | | 0.96 |
| 2.4 | plan | 0; 0; 1; 20 | 0.00 | 120.00 | 20.00 | 1.00 | 0.00 | 0.00 | 0.00 | 1.00 | 0.00 | 0.00 | 0.00 | 1.00 | 2 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.5 | Cyl_int | 0; 0; 0; 0; 0; 1; 20 | 0.00 | 0.00 | 15.00 | 1.00 | 0.00 | 0.00 | 0.00 | 1.00 | 0.00 | 0.00 | 0.00 | 1.00 | | |
| 2.5 | Cyl_int | 0; 0; 0; 0; 0; 1; 20 | 0.00 | 0.00 | 15.00 | 1.00 | 0.00 | 0.00 | 0.00 | 1.00 | 0.00 | 0.00 | 0.00 | 1.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 2.5 | Cyl_int | 0; −30; 0; 0.0; 1; 20 | 0.00 | −30.00 | 15.00 | 1.00 | 0.00 | 0.00 | 0.00 | 1.00 | 0.00 | 0.00 | 0.00 | 1.00 | 1 | |
| Indice | 1 | 0.86 | 1.00 | 0.85 | 1.00 | 1.00 | 1.00 | 1.00 | 1.00 | 1.00 | 1.00 | 1.00 | 1.00 | 1.00 | | 0.98 |
| 1.6 | Cyl_int | 0; 120; 0; 0; 0; 1; 10 | 0.00 | 120.00 | 10.00 | 1.00 | 0.00 | 0.00 | 0.00 | 1.00 | 0.00 | 0.00 | 0.00 | 1.00 | | |
| 2.6 | Cyl_int | 75; 129.9; 0; 0; 0; 1; 10 | 75.00 | 129.90 | 10.00 | 1.00 | 0.00 | 0.00 | 0.00 | 1.00 | 0.00 | 0.00 | 0.00 | 1.00 | 1 | |
| Indice | 1 | 0.57 | 0.40 | 0.95 | 1.00 | 1.00 | 1.00 | 1.00 | 1.00 | 1.00 | 1.00 | 1.00 | 1.00 | 1.00 | | 0.92 |
| 2.6 | Cyl_int | 0; 120; 0; 0; 0; 1; 10 | 0.00 | 120.00 | 10.00 | 1.00 | 0.00 | 0.00 | 0.00 | 1.00 | 0.00 | 0.00 | 0.00 | 1.00 | 2 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.7 | Plan | 1; 0; 0; 50 | 50.00 | −20.00 | 15.00 | 0.00 | 0.00 | 1.00 | 0.00 | 1.00 | 0.00 | −1.00 | 0.00 | 0.00 | | |
| 2.7 | Plan | 1; 0; 0; 50 | 50.00 | −20.00 | 15.00 | 0.00 | 0.00 | 1.00 | 0.00 | 1.00 | 0.00 | −1.00 | 0.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 2.8 | Plan | 0; 1; 0; −10 | 40.00 | −10.00 | 15.0 | 0.00 | 0.00 | 1.00 | 1.00 | 0.00 | 0.00 | 0.00 | 1.00 | 0.00 | 1 | |
| Indice | 1 | 0.50 | 0.92 | 0.95 | 1.00 | 1.00 | 1.00 | 1.00 | 0.50 | 0.50 | 1.00 | 0.46 | 0.50 | 1.00 | | 0.81 |
| 2.15 | Plan | 0.866; 0.5; 0; −45 | −23.48 | −49.33 | 15.00 | 0.00 | 0.00 | 1.00 | 0.50 | −0.87 | 0.00 | 0.87 | 0.50 | 0.00 | 2 | |
| Indice | 1 | 0.00 | 0.50 | 0.81 | 1.00 | 1.00 | 1.00 | 1.00 | 0.75 | 0.57 | 1.00 | 0.54 | 0.75 | 1.00 | | 0.78 |
| 2.16 | Plan | −0.5; 0.866; 0; −35.98 | −29.64 | −58.66 | 15.00 | 0.00 | 0.00 | 1.00 | −0.87 | −0.50 | 0.00 | 0.50 | −0.87 | 0.00 | 2 | |
| Indice | 1 | 0.00 | 0.45 | 0.76 | 1.00 | 1.00 | 1.00 | 1.00 | 0.07 | 0.75 | 1.00 | 0.73 | 0.07 | 1.00 | | 0.70 |
| 2.9 | Plan | 1; 0; 0; 30 | 30.00 | −5.00 | 15.00 | 0.00 | 0.00 | 1.00 | 0.00 | 1.00 | 0.00 | −1.00 | 0.00 | 0.00 | | |
| 2.9 | Plan | 1; 0; 0; 30 | 30.00 | −5.00 | 15.00 | 0.00 | 0.00 | 1.00 | 0.00 | 1.00 | 0.00 | −1.00 | 0.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 2.15 | Plan | 1; 0; 0; −30 | −30.00 | −5.00 | 15.00 | 0.00 | 0.00 | 1.00 | 0.00 | 1.00 | 0.00 | −1.00 | 0.00 | 0.00 | 1 | |
| Indice | 1 | 0.75 | 0.52 | 1.00 | 1.00 | 1.00 | 1.00 | 1.00 | 1.00 | 1.00 | 1.00 | 1.00 | 1.00 | 1.00 | | 0.99 |
| 2.9 | Plan | 0.866; 0.5; 0; 15 | 28.48 | −19.33 | 15.00 | 0.00 | 0.00 | 1.00 | 0.50 | −0.87 | 0.00 | 0.87 | 0.50 | 0.00 | 2 | |

TABLE 5-continued

Pruned post-pairing and post-reconciliation results of 3D models (not final)

| Mod.3D | Type | Type_Par | Gx | Gy | Gz | A1x | A1y | A1z | A2x | A2y | A2z | A3x | A3y | A3z | Matrice | Indice |
|---|---|---|---|---|---|---|---|---|---|---|---|---|---|---|---|---|
| Indice | 1 | 0.00 | 0.99 | 0.93 | 1.00 | 1.00 | 1.00 | 1.00 | 0.75 | 0.07 | 1.00 | 0.00 | 0.75 | 1.00 | | 0.75 |
| 2.15 | Plan | 0.866; 0.5; 0; −45 | −23.48 | −49.33 | 15.00 | 0.00 | 0.00 | 1.00 | 0.50 | −0.87 | 0.00 | 0.87 | 0.50 | 0.00 | 2 | |
| Indice | 1 | 0.00 | 0.58 | 0.78 | 1.00 | 1.00 | 1.00 | 0.75 | 0.07 | 1.00 | 0.00 | 0.75 | 1.00 | | | 0.71 |
| 1.10 | Cyl_ext | 0; 0; 0; 0; 0; 1; 30 | 22.98 | 16.25 | 15.00 | −0.58 | 0.82 | 0.00 | 0.00 | 0.00 | −1.00 | −0.82 | −0.58 | 0.00 | | |
| 2.10 | Cyl_ext | 0; 0; 0; 0; 0; 1; 30 | −3.79 | 17.45 | 15.20 | 1.00 | −0.07 | 0.01 | −0.07 | −0.99 | −0.14 | 0.02 | 0.14 | −0.99 | 1 | |
| Indice | 1 | 1.00 | 0.79 | 0.99 | 0.99 | 0.00 | 0.41 | 0.99 | 0.97 | 0.51 | 0.57 | 0.55 | 0.64 | 0.51 | | 0.71 |
| 2.10 | Cyl_ext | 0; −30; 0; 0; 0; 1; 30 | −12.01 | −16.78 | 15.20 | 0.90 | 0.44 | 0.01 | 0.54 | −0.89 | −0.14 | −0.05 | 0.13 | −0.99 | 2 | |
| Indice | 1 | 0.75 | 0.72 | 0.84 | 0.98 | 0.07 | 0.75 | 0.99 | 0.73 | 0.56 | 0.57 | 0.59 | 0.65 | 0.51 | | 0.69 |
| 1.11 | Plan | 1; 0; 0; 10 | 10.00 | 60.00 | 11.97 | 0.00 | 0.99 | −0.15 | 0.00 | −0.15 | −0.99 | −1.00 | 0.00 | 0.00 | | |
| 2.11 | Plan | 0.866; −0.5; 0; 10 | 45.10 | 58.12 | 10.59 | 0.50 | 0.86 | −0.09 | −0.04 | −0.08 | −1.00 | −0.87 | 0.50 | 0.00 | 1 | |
| Indice | 1 | 0.25 | 0.72 | 0.99 | 0.95 | 0.68 | 0.92 | 0.95 | 0.98 | 0.96 | 1.00 | 0.93 | 0.75 | 1.00 | | 0.86 |
| 2.13 | Plan | 0.866; −0.5; 0; −10 | 27.78 | 68.12 | 10.59 | 0.50 | 0.86 | −0.09 | −0.04 | −0.08 | −1.00 | −0.87 | 0.50 | 0.00 | 1 | |
| Indice | 1 | 0.00 | 0.86 | 0.96 | 0.96 | 0.68 | 0.92 | 0.95 | 0.98 | 0.96 | 1.00 | 0.93 | 0.75 | 1.00 | | 0.85 |
| 2.11 | Plan | 1; 0; 0; 10 | 10.00 | 42.88 | 10.59 | 0.00 | 1.00 | −0.09 | 0.00 | −0.09 | −1.00 | −1.00 | 0.00 | 0.00 | 2 | |
| Indice | 1 | 1.00 | 1.00 | 0.92 | 0.95 | 1.00 | 1.00 | 0.95 | 1.00 | 0.97 | 1.00 | 1.00 | 1.00 | 1.00 | | 0.98 |
| 2.13 | Plan | 1; 0; 0; −10 | −10.00 | 42.88 | 10.59 | 0.00 | 1.00 | −0.09 | 0.00 | −0.09 | −1.00 | −1.00 | 0.00 | 0.00 | 2 | |
| Indice | 1 | 0.75 | 0.84 | 0.92 | 0.96 | 1.00 | 1.00 | 0.95 | 1.00 | 0.97 | 1.00 | 1.00 | 1.00 | 1.00 | | 0.96 |
| 1.12 | Cyl_ext | 0; 120; 0; 0; 0; 1, 20 | 0.00 | 122.24 | 10.48 | 1.00 | 0.00 | 0.00 | 0.00 | −1.00 | 0.07 | 0.00 | −0.07 | −1.00 | | |
| 2.12 | Cyl_ext | 75; 129.9; 0; 0; 0; 1; 20 | 76.01 | 131.66 | 10.45 | 0.87 | −0.50 | 0.00 | −0.50 | −0.86 | 0.07 | −0.03 | −0.06 | −1.00 | 1 | |
| Indice | 1 | 0.25 | 0.40 | 0.95 | 1.00 | 0.82 | 0.67 | 1.00 | 0.75 | 0.93 | 1.00 | 0.98 | 1.00 | 1.00 | | 0.85 |
| 2.12 | Cyl_ext | 0; 120; 0; 0; 0; 1; 20 | 0.00 | 122.03 | 10.45 | 1.00 | 0.00 | 0.00 | 0.00 | −1.00 | 0.07 | 0.00 | −0.07 | −1.00 | 2 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 1.13 | Plan | 1; 0; 0; −10 | −10.00 | 60.00 | 11.97 | 0.00 | 0.99 | −0.15 | 0.00 | −0.15 | −0.99 | −1.00 | 0.00 | 0.00 | | |
| 2.11 | Plan | 0.866; −0.5; 0; 10 | 45.10 | 58.12 | 10.59 | 0.50 | 0.86 | −0.09 | −0.04 | −0.08 | −1.00 | −0.87 | 0.50 | 0.00 | 1 | |
| Indice | 1 | 0.50 | 0.56 | 0.99 | 0.95 | 0.68 | 0.92 | 0.95 | 0.98 | 0.96 | 1.00 | 0.93 | 0.75 | 1.00 | | 0.87 |
| 2.13 | Plan | 0.866; −0.5; 0; −10 | 27.78 | 68.12 | 10.59 | 0.50 | 0.86 | −0.09 | −0.04 | −0.08 | −1.00 | −0.87 | 0.50 | 0.00 | 1 | |
| Indice | 1 | 0.50 | 0.70 | 0.96 | 0.95 | 0.68 | 0.92 | 0.95 | 0.98 | 0.96 | 1.00 | 0.93 | 0.75 | 1.00 | | 0.88 |
| 2.11 | Plan | 1; 0; 0; 10 | 10.00 | 42.88 | 10.59 | 0.00 | 1.00 | −0.09 | 0.00 | −0.09 | −1.00 | −1.00 | 0.00 | 0.00 | 2 | |
| Indice | 1 | 0.75 | 0.84 | 0.92 | 0.96 | 1.00 | 1.00 | 0.95 | 1.00 | 0.97 | 1.00 | 1.00 | 1.00 | 1.00 | | 0.96 |
| 2.13 | Plan | 1; 0; 0; −10 | −10.00 | 42.88 | 10.59 | 0.00 | 1.00 | −0.09 | 0.00 | −0.09 | −1.00 | −1.00 | 0.00 | 0.00 | 2 | |
| Indice | 1 | 1.00 | 1.00 | 0.92 | 0.95 | 1.00 | 1.00 | 0.95 | 1.00 | 0.97 | 1.00 | 1.00 | 1.00 | 1.00 | | 0.98 |
| 1.14 | Cyl_ext | 0; 0; 0; 0; 0; 1; 30 | −22.98 | 16.25 | 15.00 | 0.58 | 0.82 | 0.00 | 0.00 | 0.00 | −1.00 | −0.82 | 0.58 | 0.00 | | |
| 2.10 | Cyl_ext | 0; 0; 0; 0; 0; 1; 30 | −3.79 | 17.45 | 15.20 | 1.00 | −0.07 | 0.01 | −0.07 | −0.99 | −0.14 | 0.02 | 0.14 | −0.99 | 1 | |
| Indice | 1 | 1.00 | 0.85 | 0.99 | 0.99 | 0.73 | 0.41 | 0.99 | 0.97 | 0.51 | 0.57 | 0.55 | 0.78 | 0.51 | | 0.78 |
| 2.10 | Cyl_ext | 0; −30; 0; 0; 0; 1; 30 | −12.01 | −16.78 | 15.20 | 0.90 | 0.44 | 0.01 | 0.54 | −0.89 | −0.14 | −0.05 | 0.13 | −0.99 | 2 | |
| Indice | 1 | 0.75 | 0.91 | 0.84 | 0.99 | 0.80 | 0.75 | 0.99 | 0.73 | 0.56 | 0.57 | 0.59 | 0.78 | 0.51 | | 0.77 |
| 1.15 | Plan | 1; 0; 0; −30 | −30.00 | −5.00 | 15.00 | 0.00 | 0.00 | 1.00 | 0.00 | 1.00 | 0.00 | −1.00 | 0.00 | 0.00 | | |
| 2.9 | Plan | 1; 0; 0; 30 | 30.00 | −5.00 | 15.00 | 0.00 | 0.00 | 1.00 | 0.00 | 1.00 | 0.00 | −1.00 | 0.00 | 0.00 | 1 | |
| Indice | 1 | 0.75 | 0.52 | 1.00 | 1.00 | 1.00 | 1.00 | 1.00 | 1.00 | 1.00 | 1.00 | 1.00 | 1.00 | 1.00 | | 0.95 |
| 2.15 | Plan | 1; 0; 0; −30 | −30.00 | −5.00 | 15.00 | 0.00 | 0.00 | 1.00 | 0.00 | 1.00 | 0.00 | −1.00 | 0.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 2.9 | Plan | 0.866; 0.5; 0; 15 | 28.48 | −19.33 | 15.00 | 0.00 | 0.00 | 1.00 | 0.50 | −0.87 | 0.00 | 0.87 | 0.50 | 0.00 | 2 | |
| Indice | 1 | 0.25 | 0.54 | 0.93 | 1.00 | 1.00 | 1.00 | 1.00 | 0.75 | 0.07 | 1.00 | 0.00 | 0.75 | 1.00 | | 0.73 |
| 2.15 | Plan | 0.866; 0.5; 0; −45 | −23.48 | −49.33 | 15.00 | 0.00 | 0.00 | 1.00 | 0.50 | −0.87 | 0.00 | 0.87 | 0.50 | 0.00 | 2 | |
| Indice | 1 | 0.25 | 0.95 | 0.78 | 1.00 | 1.00 | 1.00 | 1.00 | 0.75 | 0.07 | 1.00 | 0.00 | 0.75 | 1.00 | | 0.75 |
| 1.16 | Plan | 0; 1; 0; −10 | −40.00 | −10.00 | 15.00 | 0.00 | 0.00 | 1.00 | 1.00 | 0.00 | 0.00 | 0.00 | 1.00 | 0.00 | | |
| 2.7 | Plan | 1; 0; 0; 50 | 50.00 | −20.00 | 15.00 | 0.00 | 0.00 | 1.00 | 0.00 | 1.00 | 0.00 | −1.00 | 0.00 | 0.00 | 1 | |
| Indice | 1 | 0.25 | 0.29 | 0.95 | 1.00 | 1.00 | 1.00 | 1.00 | 0.50 | 0.90 | 1.00 | 0.46 | 0.50 | 1.00 | | 0.75 |
| 2.8 | Plan | 0; 1; 0; −10 | 40.00 | −10.00 | 15.00 | 0.00 | 0.00 | 1.00 | 1.00 | 0.00 | 0.00 | 0.00 | 1.00 | 0.00 | 1 | |
| Indice | 1 | 1.00 | 0.37 | 1.00 | 1.00 | 1.00 | 1.00 | 1.00 | 1.00 | 1.00 | 1.00 | 1.00 | 1.00 | 1.00 | | 0.95 |
| 2.16 | Plan | 0; 1; 0; −10 | −40.00 | −10.00 | 15.00 | 0.00 | 0.00 | 1.00 | 1.00 | 0.00 | 0.00 | 0.00 | 1.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 2.17 | Plan | 1; 0; 0; −50 | −50.00 | −20.00 | 15.00 | 0.00 | 0.00 | 1.00 | 0.00 | 1.00 | 0.00 | −1.00 | 0.00 | 0.00 | 1 | |
| Indice | 1 | 0.75 | 0.92 | 0.95 | 1.00 | 1.00 | 1.00 | 1.00 | 0.50 | 0.50 | 1.00 | 0.46 | 0.50 | 1.00 | | 0.83 |
| 2.7 | Plan | 1; 0; 0; 50 | 50.00 | −20.00 | 15.00 | 0.00 | 0.00 | 1.00 | 0.00 | 1.00 | 0.00 | −1.00 | 0.00 | 0.00 | 2 | |
| Indice | 1 | 0.25 | 0.29 | 0.95 | 1.00 | 1.00 | 1.00 | 1.00 | 0.50 | 0.50 | 1.00 | 0.46 | 0.50 | 1.00 | | 0.75 |
| 2.8 | Plan | 0; 1; 0; −10 | 40.00 | −10.00 | 15.00 | 0.00 | 0.00 | 1.00 | 1.00 | 0.00 | 0.00 | 0.00 | 1.00 | 0.00 | 2 | |
| Indice | 1 | 1.00 | 0.37 | 1.00 | 1.00 | 1.00 | 1.00 | 1.00 | 1.00 | 1.00 | 1.00 | 1.00 | 1.00 | 1.00 | | 0.95 |
| 2.16 | Plan | −0.5; 0.866; 0; −35.98 | −29.64 | −58.66 | 15.00 | 0.00 | 0.00 | 1.00 | −0.87 | −0.50 | 0.00 | 0.50 | −0.87 | 0.00 | 2 | |
| Indice | 1 | 0.25 | 0.92 | 0.76 | 1.00 | 1.00 | 1.00 | 1.00 | 0.07 | 0.75 | 1.00 | 0.73 | 0.07 | 1.00 | | 0.75 |
| 2.17 | Plan | 0.866; 0.5; 0; −65 | −33.30 | −72.32 | 15.00 | 0.00 | 0.00 | 1.00 | 0.50 | −0.87 | 0.00 | 0.87 | 0.50 | 0.00 | 2 | |
| Indice | 1 | 0.25 | 0.95 | 0.69 | 1.00 | 1.00 | 1.00 | 1.00 | 0.75 | 0.57 | 1.00 | 0.54 | 0.75 | 1.00 | | 0.02 |
| 1.18 | Plan | 0; 1; 0; −30 | 0.00 | −30.00 | 15.00 | 0.00 | 0.00 | 1.00 | 1.00 | 0.00 | 0.00 | 0.00 | −1.00 | 0.00 | | |
| 2.18 | Plan | 0; 1; 0; −30 | 0.00 | −30.00 | 15.00 | 0.00 | 0.00 | 1.00 | 1.00 | 0.00 | 0.00 | 0.00 | −1.00 | 0.00 | 1 | |
| Indice | 1 | 1.00 | 1.00 | 1.00 | 1.00 | 1.00 | 1.00 | 1.00 | 1.00 | 1.00 | 1.00 | 1.00 | 1.00 | 1.00 | | 1.00 |
| 2.18 | Plan | −0.5; 0.866; 0; −55.98 | 15.00 | −55.98 | 15.00 | 0.87 | 0.50 | 0.00 | 0.00 | 0.00 | −1.00 | −0.50 | 0.87 | 0.00 | 2 | |
| Indice | 1 | 0.25 | 0.88 | 0.87 | 1.00 | 0.92 | 0.67 | 1.00 | 1.00 | 1.00 | 0.00 | 0.73 | 0.07 | 1.00 | | 0.74 |

The invention claimed is:

1. A process for comparing a reference 3D model with a target 3D model to comparatively analyse 3D models, said process comprising:
   providing at least one descriptor for each of said 3D models, said at least one descriptor comprising for each of a number of parts of said 3D models related geometrical characteristics which do not vary according to the modelling frame of reference and related geometrical characteristics which depend on said frame of reference;
   using the related geometrical characteristics which do not vary according to the frame of reference to pair parts of the reference 3D model with parts of the target 3D model according to an acceptable error range;
       using at least one vector value of the related geometrical characteristics which depend on the frame of reference transformations relating said at least one vector value from parts from the reference 3D model with said at least one vector value from parts of the target 3D model for which pairing was successful in a previous step;
       determining similarity among said transformations;
       identifying at least one group of similar ones of said transformations; and
           generating data identifying the similarities and differences between said reference 3D model and the target 3D model, at least in part, using said at least one group of similar transformations.

2. The process according to claim 1, wherein the related geometrical characteristics which do not vary according to the modelling frame of reference comprise an area or a perimeter of planar faces of the model, and the related geometrical characteristics which depend on the modelling frame of reference comprising the center of gravity or the axes of the moments of inertia of the planar faces.

3. The process according to claim 1, wherein the step of determining at least one group of similar transformations comprises determining at least two groups of similar transformations in order to allow a comparison of similar 3D models where at least one part of the reference 3D model is in a different position with respect to a corresponding part of the target 3D model.

4. The process according to claim 3, wherein the differences between said 3D models are identified, at least in part, by said at least two groups of similar transformations.

5. The process according to claim 1, wherein the at least one descriptor of said reference 3D model is compared to the at least one descriptor of said target 3D model, and the step of using related geometrical characteristics which do not vary according to the frame of reference to pair parts of said reference 3D model and parts of said target 3D model is done for said at least one descriptor of said target 3D model to prioritize or limit the step of using the related geometrical characteristics which depend on the frame of reference according to the pairing of the at least one descriptor.

6. The process according to claim 1, wherein pairing data and transformation groups data are stored to facilitate more targeted comparisons or following comparisons.

7. The process according to claim 1, wherein the at least one descriptor of said reference 3D model is compared to the at least one descriptor of said target 3D model, and comparison results are displayed grouped according to the pairing and according to the transformations groups.

8. The process according to claim 1, wherein there is presented said reference 3D model compared to said target 3D model with faces colored or hatched to identify resemblances and differences between the 3D models.

9. The process according to claim 8, wherein there is presented at least two similarities or differences of geometric characteristics related to the same corresponding faces between the two 3D models.

10. A data processing system configured to execute the process for comparing 3D models for searching, classifying or comparatively analysing 3D models according to claim 1.

11. A manufacturing process, characterized by a use of a 3D model for a manufacturing of at least one part of a product, said 3D model being directly selected or modified from a selected 3D model using a comparison process according to claim 1.

* * * * *